(12) United States Patent
Lee et al.

(10) Patent No.: US 7,423,102 B2
(45) Date of Patent: Sep. 9, 2008

(54) STAR POLYMER

(75) Inventors: Youngjoon Lee, Minoo (JP); Yasuhiro Watanabe, Niihama (JP); Takayuki Miyagawa, Toyonaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 359 days.

(21) Appl. No.: 11/169,790

(22) Filed: Jun. 30, 2005

(65) Prior Publication Data

US 2006/0014913 A1    Jan. 19, 2006

(30) Foreign Application Priority Data

Jul. 5, 2004    (JP)    ............... 2004-197717

(51) Int. Cl.
    *C08F 118/02*    (2006.01)
(52) U.S. Cl. .................. 526/200; 526/204; 526/222; 526/262; 526/268; 526/270; 526/271; 526/281; 526/284; 526/319
(58) Field of Classification Search .......... 526/200, 526/204, 222, 262, 268, 270, 271, 281, 284, 526/319
    See application file for complete search history.

(56) References Cited

FOREIGN PATENT DOCUMENTS

| JP | 2005-053996 | * | 3/2005 |
| JP | 2005-070742 | * | 3/2005 |

OTHER PUBLICATIONS

Stenzel-Rosenbaum et al., Macromolecules, vol. 34, pp. 5433-5438, (2001).
Hovestad et al., Macromolecules, vol. 33, pp. 4048-4052, (2000).

* cited by examiner

*Primary Examiner*—Helen L. Pezzuto
(74) *Attorney, Agent, or Firm*—Birch, Stewart, Kolasch & Birch, LLP

(57) ABSTRACT

The present invention provides a star polymer which comprises a central core and three or more branches bonded to the central core, and has a weight average molecular weight of from 1,000 to 100,000, wherein at least one of the branches containing at least one repeating unit selected from the group consisting of the following repeating units (1), (2), (3), (4) and (9); and a process for producing the star polymer. The present invention also provides a chemically amplified positive resist composition comprising the star polymer and an acid generator.

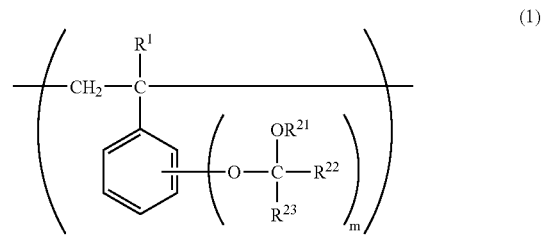

(1)

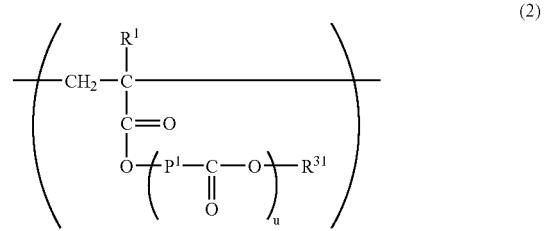

(2)

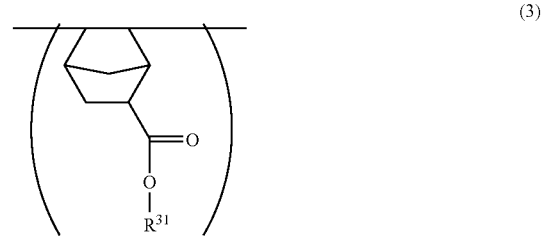

(3)

(4)

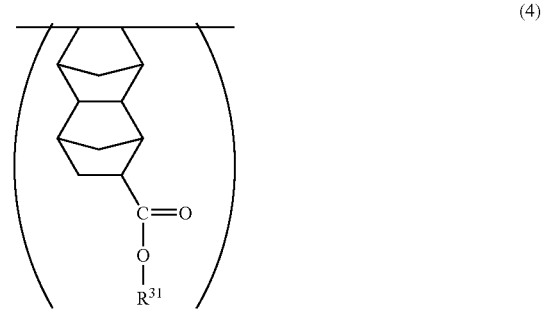

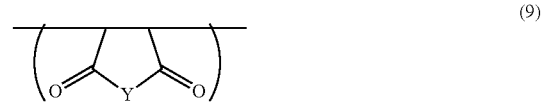

(9)

11 Claims, No Drawings

STAR POLYMER

This nonprovisional application claims priority under 35 U.S.C. § 119(a) on Patent Application No. 2004-197717 filed in JAPAN on Jul. 5, 2004, the entire contents of which are hereby incorporated by reference.

FIELD OF THE INVENTION

The present invention relates to a star polymer, its production method, and a chemically amplified positive resist composition containing the star polymer for use in micro fabrication of semiconductor.

BACKGROUND OF THE INVENTION

Semiconductor microfabrication employs a lithography process using a resist composition. In lithography, theoretically, the shorter the exposure wavelength becomes, the higher the resolution can be made, as expressed by Rayleigh's diffraction limit formula. The wavelength of an exposure light source for lithography used in the manufacture of semiconductor devices has been shortened year by year as g line having a wavelength of 436 nm, i line having a wavelength of 365 nm and KrF excimer laser having a wavelength of 248 nm. ArF excimer laser having a wavelength of 193 nm seems to be promising as the next-generation exposure light source.

As lenses used for ArF excimer laser steppers have shorter lives than those used for conventional laser steppers having longer wavelength, it is desirable that exposure time to ArF excimer laser light becomes as short as possible. As it is necessary to enhance the sensitivity of resists for the purpose above, chemically amplified resists utilizing the catalytic action of an acid generated by exposure and containing a resin having a group being dissociated by the acid.

It is known that a resin used in the resist for exposure to ArF excimer laser light is better not to have aromatic ring(s) to secure transmittance of the resist and better to have aliphatic ring(s) in place of aromatic ring(s) to provide dry etching resistance. As such a resin, various resins are known (for example, see D. C. Hofer, Journal of Photopolymer Science and Technology, Vol. 9, No. 3, 387-398 (1996)). However, conventionally known resins have been associated with a problem that line edge roughness is deteriorated.

SUMMARY OF THE INVENTION

An object of the present invention is to provide a chemically amplified positive resist composition that is suitable for excimer laser lithography with ArF, KrF, and the like, excellent in various resist performances such as sensitivity and resolution, and particularly excellent in line edge roughness.

Other objects of the present invention are to provide a star polymer that is preferably used as a resin component for the chemically amplified positive resist composition and a production method thereof.

The present invention relates to the followings:

<1> A star polymer which comprises a central core and three or more branches bonded to the central core, and has a weight average molecular weight of from 1,000 to 100,000,
wherein at least one of the branches containing at least one repeating unit selected from the group consisting of the following repeating units of the formulae (1), (2), (3), (4) and (9);

the formula (1)

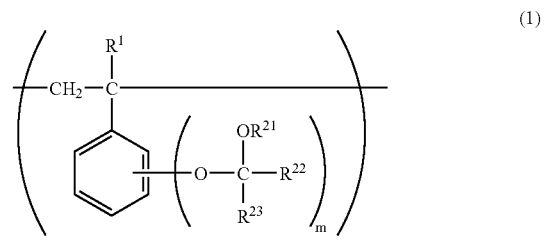

wherein $R^1$ represents a hydrogen atom, an alkyl group having 1 to 4 carbon atoms, or a fluoroalkyl group having 1 to 4 carbon atoms, $R^{21}$ and $R^{22}$ each independently represents an alkyl group having 1 to 6 carbon atoms, a cycloalkyl group having 3 to 6 carbon atoms, a haloalkyl group having 1 to 6 carbon atoms, a halocycloalkyl group having 3 to 10 carbon atoms, or a phenyl group wherein at least one hydrogen atom in the phenyl group may be substituted by an alkyl group having 1 to 4 carbon atom or a halogen atom, or $R^{21}$ and $R^{22}$ bond to form a divalent saturated aliphatic hydrocarbon group having from 5 to 10 carbon atoms, $R^{23}$ represents a hydrogen atom, an alkyl group having 1 to 10 carbon atoms, a cycloalkyl group having 3 to 10 carbon atoms, a haloalkyl group having 1 to 10 carbon atoms, a halocycloalkyl group having 3 to 10 carbon atoms, or an aralkyl group having 7 to 12 carbon atoms, with the proviso that $R^{22}$ is methyl, or the carbon atom in $R^{22}$ linked to the carbon atom adjacent to $R^{22}$ is a secondary or primary carbon atom when $R^{23}$ is a hydrogen atom or the carbon atom in $R^{23}$ linked to the carbon atom adjacent to $R^{22}$ is a tertiary carbon atom, m is an integer of 1 to 3 and when m is 2 or 3, each of the group of the formula $-(OC(OR^{21})R^{22}R^{23})$ may be the same or different;

the formula (2)

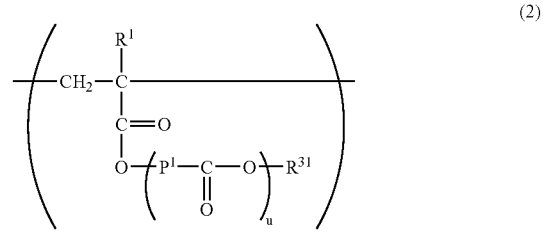

$R^{31}$ represents a hydrocarbon group having 1 to 20 carbon atoms or a group of the formula $-CH(R^{33})-OR^{34}$, u is an integer of 0 to 2, $-CH_2-$ in $R^{31}$ not linked to the oxygen adjacent to $R^{31}$ may be substituted by $-COO-$ or $-O-$, and at least one hydrogen atom in $R^{31}$ may be substituted by a hydroxyl group, a cyano group, a halogen atom or an alkoxy group, $R^{33}$ represents an alkyl group having 1 to 5 carbon atoms or an alicyclic hydrocarbon group having 3 to 10 carbon atoms, $R^{34}$ represents an alkyl group having 1 to 3 carbon atoms, an alicyclic hydrocarbon group having 3 to 10 carbon atoms, a group of the formula $-R^{40}-O-R^{41}$, or a group of the formula $-R^{42}-O(C=O)-R^{43}$, or $R^{33}$ and $R^{34}$ bond to form an divalent saturated aliphatic hydrocarbon group having from 3 to 10 carbon atoms, in the divalent aliphatic hydrocarbon group, —CH$_2$— not linked to the oxygen adjacent to R$^{31}$ may optionally be substituted by —COO— or —O—, R$^{40}$ represents a divalent saturated aliphatic hydrocarbon group having 1 to 5 carbon atoms or a divalent alicyclic hydrocarbon group having 3 to 10 carbon atoms, R$^{41}$ represents an alkyl group having 1 to 5 carbon atoms or an alicyclic hydrocarbon group having 3 to 10 carbon atoms, R$^{42}$ represents a divalent saturated aliphatic hydrocarbon group having 1 to 5 carbon atoms or a divalent alicyclic hydrocarbon group having 3 to 10 carbon atoms, R$^{43}$ represents an alkyl group having 1 to 5 carbon atoms or an alicyclic hydrocarbon group having 3 to 10 carbon atoms;

the formula (3)

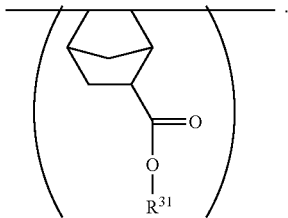

(3)

wherein R$^{31}$ has the same meaning as defined above, the formula (4)

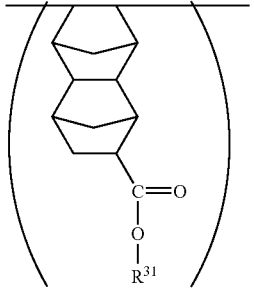

(4)

wherein R$^{31}$ has the same meaning as defined above, the formula (9)

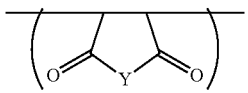

(9)

wherein Y represents an oxygen atom or —NH—.

<2> The star polymer according to <1>, wherein at least one of the branches contains at least one repeating unit selected from the group consisting of the repeating units (1), (2), (3) and (4).

<3> The star polymer according to <1> or <2>, wherein the polymer is insoluble or poorly soluble in an alkali aqueous solution but becomes soluble in an alkali aqueous solution by the action of an acid.

<4> The star polymer according to any of <1> to <3>, wherein the central core is a structural unit of the formula (I)

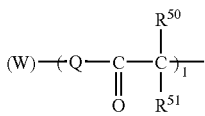

(I)

wherein (W) represents a polyvalent aromatic hydrocarbon group, a polyvalent saturated cyclic hydrocarbon group, a polyvalent saturated acyclic hydrocarbon group or a group combined by at least two of the polyvalent aromatic hydrocarbon group, the polyvalent saturated cyclic hydrocarbon group and the polyvalent saturated acyclic hydrocarbon group, wherein at least one —CH$_2$— in the polyvalent saturated cyclic hydrocarbon group and the polyvalent saturated acyclic hydrocarbon group not linked to Q may optionally be substituted by —O—, —S—, —NR$^{52}$— or —SiR$^{53}$$_2$— and at least one hydrogen atom in the polyvalent aromatic hydrocarbon group and the polyvalent saturated cyclic hydrocarbon group may optionally be substituted by an alkyl group having 1 to 6 carbon atoms, R$^{52}$ and R$^{53}$ each independently represents a hydrogen atom or an alkyl group having 1 to 6 carbon atoms, Q represents —O—, —S— or —R$^{54}$—, wherein R$^{54}$ represents a hydrogen atom or an alkyl group having 1 to 6 carbon atoms, R$^{50}$ and R$^{51}$ each independently represents an alkyl group having 1 to 6 carbon atoms, an alkylalkoxy group having 2 to 6 carbon atoms or a cycloalkyl group having 3 to 12 carbon atoms, or R$^{50}$ and R$^{51}$ link together and represents a divalent saturated aliphatic hydrocarbon group which bonds to form a divalent cyclic hydrocarbon group together with a carbon atom adjacent to R$^{50}$ and R$^{51}$, and 1 represents an integer of 3 to 12.

<5> The star polymer according to <4>, wherein (W) is neopentan-tetrayl group, 2,2',2''-nitrilotriethyl group, 2-methyltetrahydropyran-α, 3,4,5, 6-pentayl group, 2-methyltetrahydrothiopyran-α, 3,4,5,6-pentayl group, 2,5-dimethyltetrahydrofuran-α, α',2,3,4-pentayl group, or a group combined by at least two of them.

<6> The star polymer according to <4>, wherein central core is a structural unit selected from the following formulae:

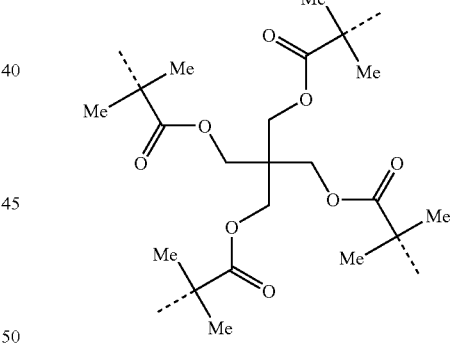

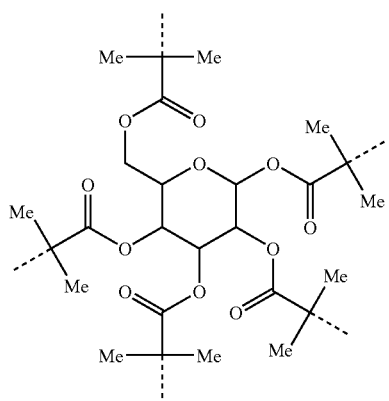

-continued

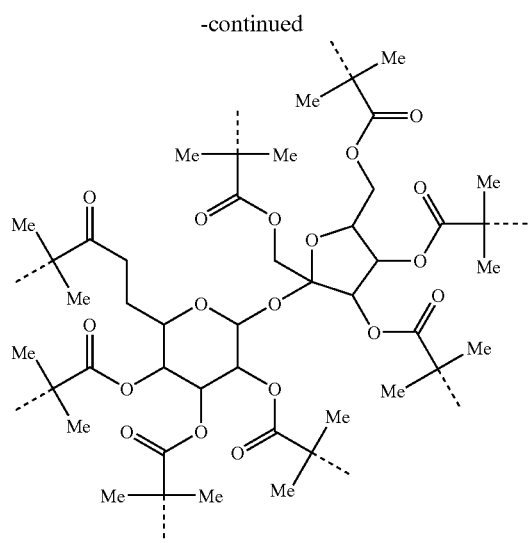

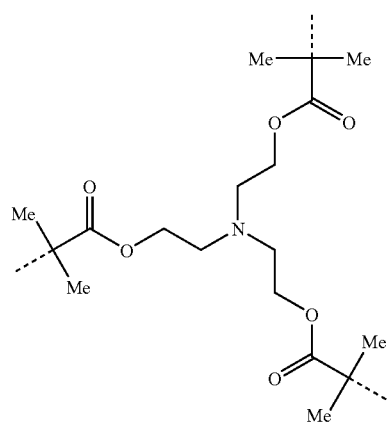

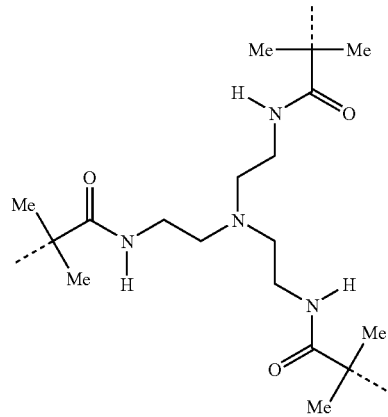

-continued

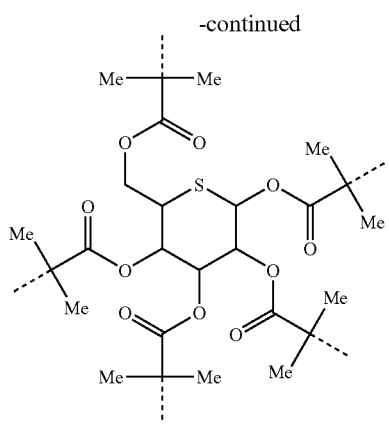

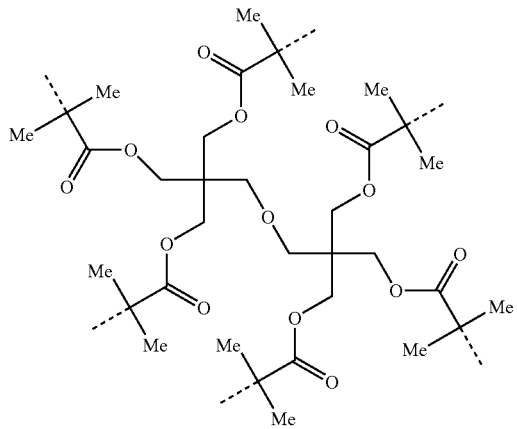

<7> The star polymer according to any of <1> to <6>, which is obtainable by reacting a radical polymerization initiator of the following formula (10) with a monomer leading to a repeating unit of at least one of the formulae (1), (2), (3), (4) and (9):

$$Z\text{-}T_p \qquad (10)$$

wherein Z represents a central core, T represents a radically transferable atom or group, and p represents an integer of 3 or more.

<8> The star polymer according to <7>, wherein the radical polymerization initiator is a compound obtained by acylating a compound of 3 to 100 carbon atoms having three or more groups in total selected from the group consisting of hydroxyl group, thiol group, and N-alkylamino group with an acylating agent having a radically transferable atom or group, and —CH$_2$— in said compound may optionally be substituted by —O—, —S—, —NR$^{52}$—, or —SiR$^{53}{}_2$—, wherein R$^{52}$ and R$^{53}$ have the same meanings as defined above.

<9> The star polymer according to <7>, wherein the radical polymerization initiator is a compound selected from the group consisting of a compound obtained by acylating a polyhydric alcohol of 3 to 100 carbon atoms having three or more hydroxyl groups with an acylating agent having a radically transferable atom or group, a compound obtained by acylating a polythioalcohol of 3 to 100 carbon atoms having three or more thiol groups with an acylating agent having a radically transferable atom or group, and a compound obtained by acylating a polyamine of 3 to 100 carbon atoms having three or more N-alkylamino groups with an acylating agent having a radically transferable atom or group, and —CH$_2$— in the compounds may optionally be substituted by —O—, —S—, —NR$^{52}$—, or —SiR$^{53}{}_2$—, wherein R$^{52}$ and R$^{53}$ have the same meanings as defined above.

<11> The star polymer according to <7>, wherein Z is a structural unit of the formula (I) and p is an integer of 3 to 12.

<11> The star polymer according to <10>, wherein the radical polymerization initiator is a compound selected from the group consisting of a compound in which hydroxyl groups of a polysaccharide or monosaccharide are acylated with an acylating agent having a radically transferable atom or group, a compound in which hydroxyl groups of a cycloalkylpolyol or alkylpolyol are acylated with an acylating agent having a radically transferable atom or group, a compound in which hydroxyl groups of a polyhydric amine are acylated with an acylating agent having a radically transferable atom or group, a compound in which hydroxyl groups of an aromatic ring are acylated with an acylating agent having a radically transferable atom or group, a compound in which hydroxyl groups of an alkylpolythiol are acylated with an acylating agent having a radically transferable atom or group and a compound in which amino groups of an alkylamine are acylated with an acylating agent having a radically transferable atom or group.

<12> The star polymer according to <10>, wherein the radical polymerization initiator is a compound selected from the group consisting of per(2-bromoisobutyryl)cyclodextrin, per(2-bromoisobutyryl)maltotriose, tetrakis(2-bromoisobutyryl)arabinose, tris(2-bromoisobutyryl)cyclohexanetriol, tetrakis(2-bromoisobutyryl)pentaerythritol, hexa(2-bromoisobutyryl)mannitol, tris(2-bromoisobutyryl)triethanolamine, tris(2-bromoisobutyryl)benzenetriol, tris(2-bromoisobutyryl)trihydroxypyrimidine, tetrakis(2-bromoisobutyryl)pentaerythrithiol, tetrakis(2-bromoisobutyryl)2,2-bis(mercaptomethyl)-1,4, butanedithiol, tetrakis(2-bromoisobutyryl)spermine and tris (2-bromoisobutyryl)spermidine, tetrakis(2-chloroisobutyryl)pentaerythritol, tetrakis(2-iodoisobutyryl) pentaerythritol, hexakis(2-bromoisobutyryl) dipentaerythritol, and octakis(2-bromoisobutyryl)sucrose.

<13> The star polymer according to <10>, wherein the radical polymerization initiator is a compound selected from the group consisting of at least one of compounds represented by the following formulae:

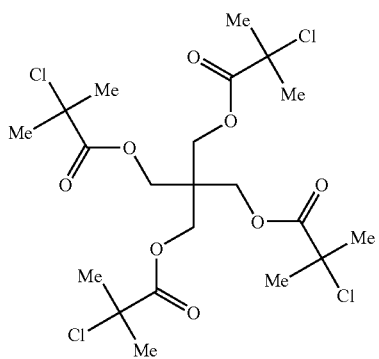

-continued

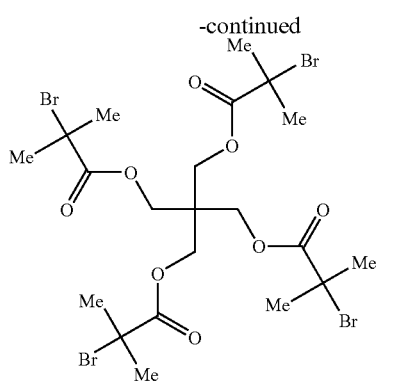

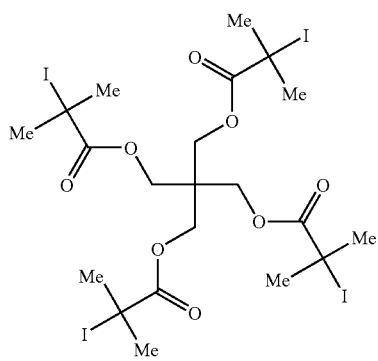

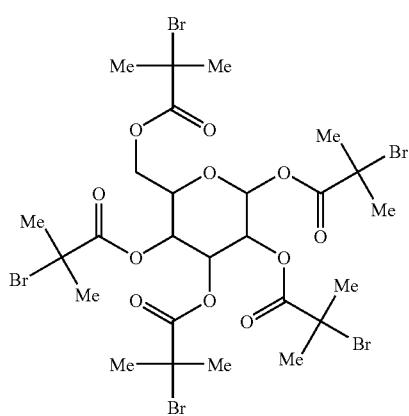

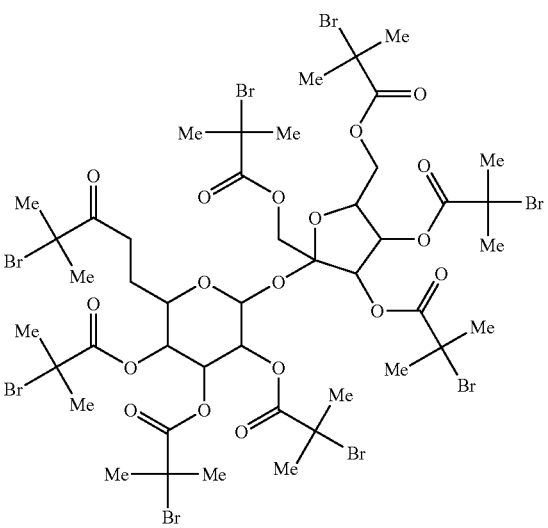

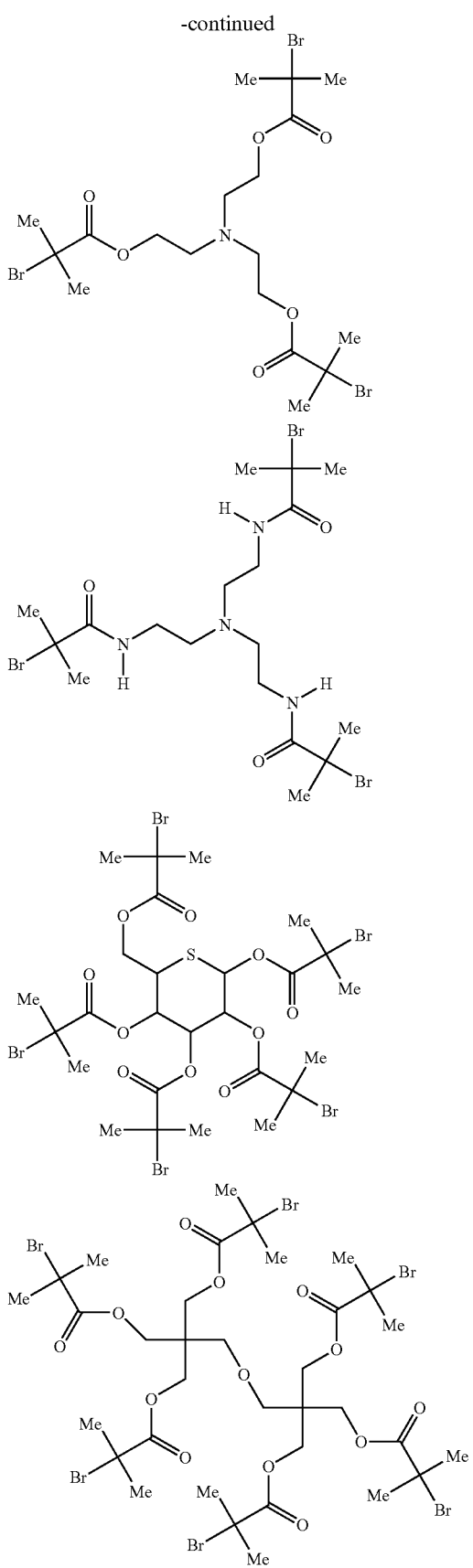

<14> A process for producing a star polymer defined in <1>, which comprises reacting a radical polymerization initiator of the above defined formula (10) with a monomer leading to a repeating unit of at least one of the above defined formulae (1), (2), (3), (4) and (9) by atom transfer radical polymerization in the presence of a catalytically effective amount of an oxidizable transition metal complex catalyst.

<15> The process according to <14>, wherein the radical polymerization initiator is a compound obtained by acylating a compound of 3 to 100 carbon atoms having three or more groups in total selected from the group consisting of hydroxyl group, thiol group, and N-alkyl amino group with an acylating agent having a radically transferable atom or group, and —$CH_2$— in said compound may optionally be substituted by —O—, —S—, —$NR^{52}$—, or —$SiR^{53}{}_2$—, wherein $R^{52}$ and $R^{53}$ have the same meanings as defined above.

<16> The process according to <14>, wherein the radical polymerization initiator is a compound selected from the group consisting of a compound obtained by acylating a polyhydric alcohol of 3 to 100 carbon atoms having three or more hydroxyl groups with an acylating agent having a radically transferable atom or group, a compound obtained by acylating a polythioalcohol of 3 to 100 carbon atoms having three or more thiol groups with an acylating agent having a radically transferable atom or group, and a compound obtained by acylating a polyamine of 3 to 100 carbon atoms having three or more N-alkylamino groups with an acylating agent having a radically transferable atom or group, and —$CH_2$— in the compounds may optionally be substituted by —O—, —S—, —$NR^{52}$—, or —$SiR^{53}{}_2$—, wherein $R^{52}$ and $R^{53}$ have the same meanings as defined above.

<17> The process according to <14>, wherein Z in the formula (10) is a group represented by the above defined formula (I) and p in the formula (10) represents an integer of 3 to 12.

<18> The process according to <17>, wherein the radical polymerization initiator is a compound selected from the group consisting of a compound in which hydroxyl groups of a polysaccharide or monosaccharide are acylated with an acylating agent having a radically transferable atom or group, a compound in which hydroxyl groups of a cycloalkylpolyol or alkylpolyol are acylated with an acylating agent having a radically transferable atom or group, a compound in which hydroxyl groups of a polyhydric amine are acylated with an acylating agent having a radically transferable atom or group, a compound in which hydroxyl groups of an aromatic ring are acylated with an acylating agent having a radically transferable atom or group, a compound in which hydroxyl groups of an alkylpolythiol are acylated with an acylating agent having a radically transferable atom or group and a compound in which amino groups of an alkylamine are acylated with an acylating agent having a radically transferable atom or group.

<19> The process according to <17>, wherein the radical polymerization initiator is a compound selected from the group consisting of per(2-bromoisobutyryl)cyclodextrin, per (2-bromoisobutyryl)maltotriose, tetrakis(2-bromoisobutyryl)arabinose, tris(2-bromoisobutyryl)cyclohexanetriol, tetrakis(2-bromoisobutyryl)pentaerythritol, hexa(2-bromoisobutyryl)mannitol, tris(2-bromoisobutyryl)triethanolamine, tris(2-bromoisobutyryl)benzenetriol, tris(2-bromoisobutyryl)trihydroxypyrimidine, tetrakis(2-bromoisobutyryl)pentaerythrithiol, tetrakis(2-bromoisobutyryl)2,2-bis(mercaptomethyl)-1,4, butanedithiol, tetrakis(2-bromoisobutyryl)spermine and tris (2-bromoisobutyryl)spermidine, tetrakis(2-chloroisobutyryl)pentaerythritol, tetrakis(2-iodoisobutyryl)

pentaerythritol, hexakis(2-bromoisobutyryl)dipentaerythritol, and octakis(2-bromoisobutyryl)sucrose.
<20> The process according to <17>, wherein the radical polymerization initiator is a compound selected from the group consisting of at least one of compounds represented by the following formulae:
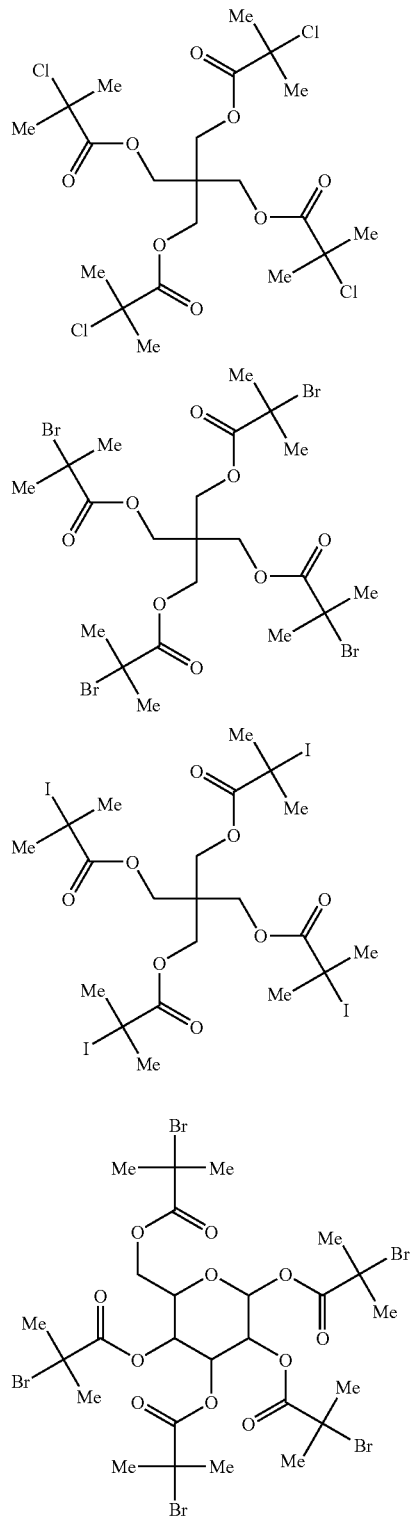
-continued
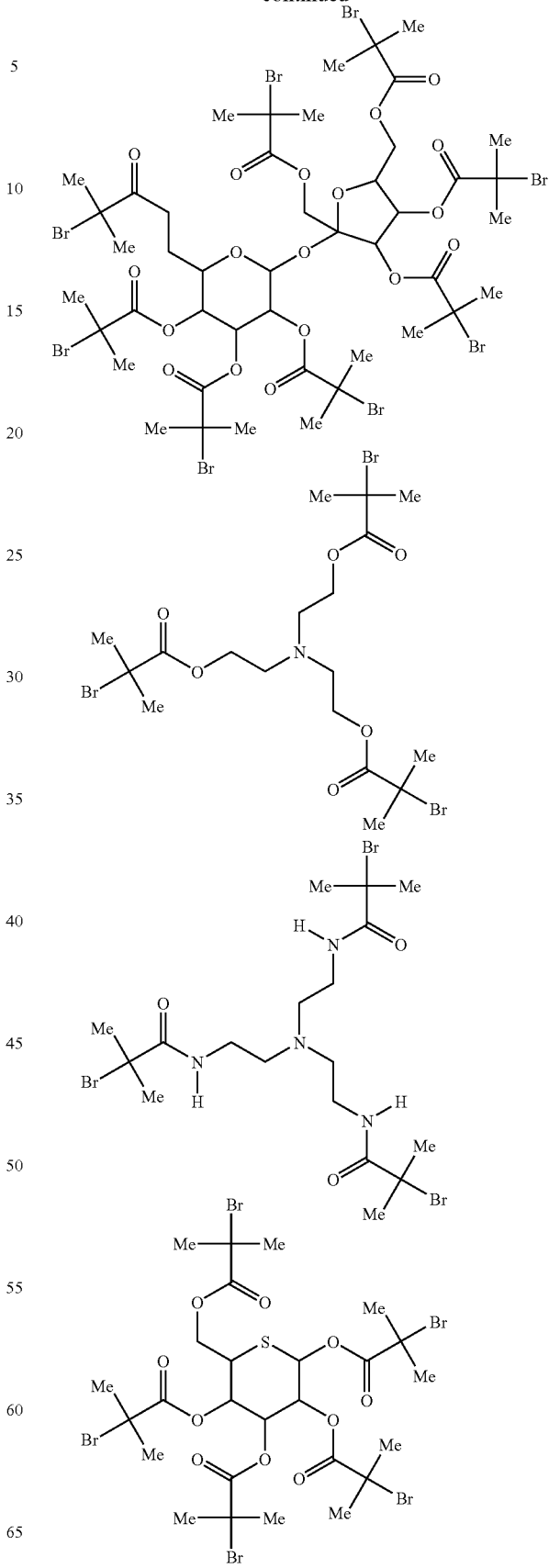

-continued

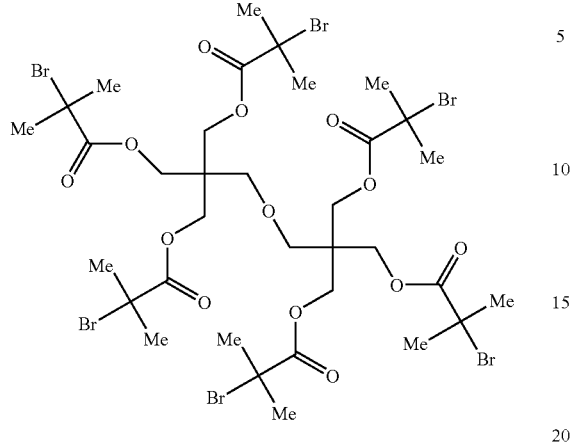

<21> A chemically amplified positive resist composition, comprising: (A) a star polymer which comprises a central core and three or more branches bonded to the central core, and has a weight average molecular weight of from 1,000 to 100,000, wherein at least one of the branches containing at least one repeating unit selected from the group consisting of the above defined repeating units of the formulae (1), (2), (3), (4) and (9), and the polymer is insoluble or poorly soluble in an alkali aqueous solution but becomes soluble in an alkali aqueous solution by the action of an acid; and (B) an acid generator.

<22> The composition according to <21>, wherein the central core is a structural unit of the above defined formula (I).

<23> The composition according to <22>, wherein (W) is neopentan-tetrayl group, 2,2',2''-nitrilotriethyl group, 2-methyltetrahydropyran-α, 3,4,5, 6-pentayl group, 2-methyltetrahydrothiopyran-α, 3,4,5,6-pentayl group, 2,5-dimethyltetrahydrofuran-α, α',2,3,4-pentayl group, or a group combined by at least two of them.

<24> The composition according to <22>, wherein the central core is a structural unit selected from the following formulae:

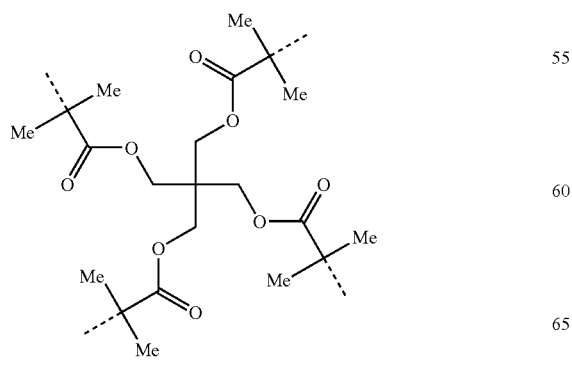

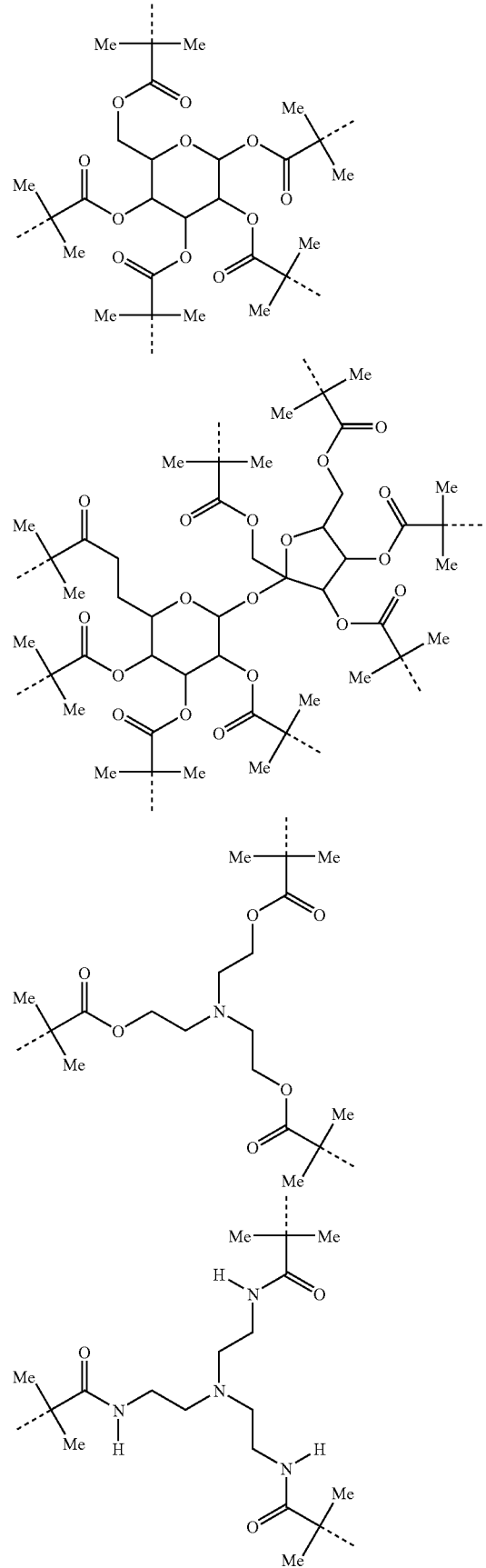

-continued

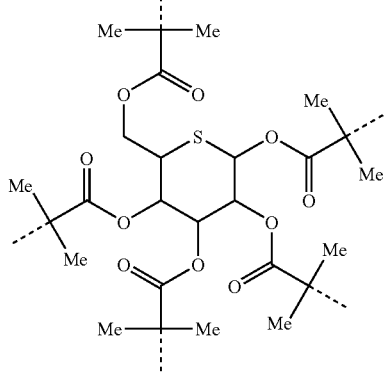

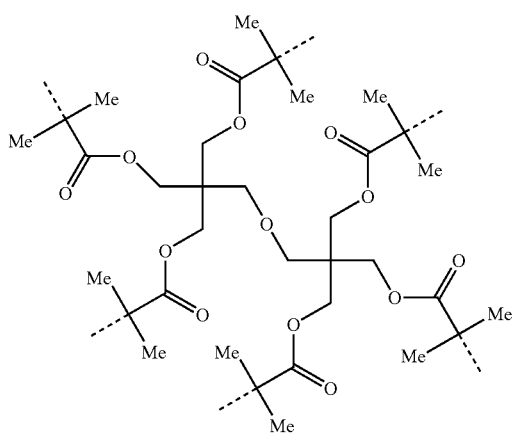

<25> The composition according to <22>, which is obtainable by reacting a radical polymerization initiator of the above defined formula (10) with a monomer leading to a structural unit of at least one of the above defined formulae (1), (2), (3), (4) and (9).

<26> The composition according to <25>, wherein the radical polymerization initiator is a compound obtained by acylating a compound of 3 to 100 carbon atoms having three or more groups in total selected from the group consisting of hydroxyl group, thiol group, and N-alkylamino group with an acylating agent having a radically transferable atom or group, and —$CH_2$— in said compound may optionally be substituted by —O—, —S—, —$NR^{52}$—, or —$SiR^{53}{}_2$—, wherein $R^{52}$ and $R^{53}$ have the same meanings as defined above.

<27> The composition according to <25>, wherein the radical polymerization initiator is a compound selected from the group consisting of a compound obtained by acylating a polyhydric alcohol of 3 to 100 carbon atoms having three or more hydroxyl groups with an acylating agent having a radically transferable atom or group, a compound obtained by acylating a polythioalcohol of 3 to 100 carbon atoms having three or more thiol groups with an acylating agent having a radically transferable atom or group, and a compound obtained by acylating a polyamine of 3 to 100 carbon atoms having three or more N-alkylamino groups with an acylating agent having a radically transferable atom or group, and —$CH_2$— in the compounds may optionally be substituted by —O—, —S—, —$NR^{52}$—, or —$SiR^{53}{}_2$—, wherein $R^{52}$ and $R^{53}$ have the same meanings as defined above.

<28> The composition according to claim 25, wherein Z is a structural unit of the above defined formula (I) and p is an integer of 3 to 12.

<29> The composition according to <25>, wherein the radical polymerization initiator is a compound selected from the group consisting of a compound in which hydroxyl groups of a polysaccharide or monosaccharide are acylated with an acylating agent having a radically transferable atom or group, a compound in which hydroxyl groups of a cycloalkylpolyol or alkylpolyol are acylated with an acylating agent having a radically transferable atom or group, a compound in which hydroxyl groups of a polyhydric amine are acylated with an acylating agent having a radically transferable atom or group, a compound in which hydroxyl groups of an aromatic ring are acylated with an acylating agent having a radically transferable atom or group, a compound in which hydroxyl groups of an alkylpolythiol are acylated with an acylating agent having a radically transferable atom or group and a compound in which amino groups of an alkylamine are acylated with an acylating agent having a radically transferable atom or group.

<30> The composition according to <28>, wherein the radical polymerization initiator is a compound selected from the group consisting of per(2-bromoisobutyryl)cyclodextrin, per(2-bromoisobutyryl)maltotriose, tetrakis(2-bromoisobutyryl)arabinose, tris(2-bromoisobutyryl)cyclohexanetriol, tetrakis(2-bromoisobutyryl)pentaerythritol, hexa(2-bromoisobutyryl)mannitol, tris(2-bromoisobutyryl)triethanolamine, tris(2-bromoisobutyryl)benzenetriol, tris(2-bromoisobutyryl)trihydroxypyrimidine, tetrakis(2-bromoisobutyryl)pentaerythrithiol, tetrakis(2-bromoisobutyryl)2,2-bis(mercaptomethyl)-1,4,butanedithiol, tetrakis(2-bromoisobutyryl)spermine and tris(2-bromoisobutyryl)spermidine, tetrakis(2-chloroisobutyryl)pentaerythritol, tetrakis(2-iodoisobutyryl)pentaerythritol, hexakis(2-bromoisobutyryl)dipentaerythritol, and octakis(2-bromoisobutyryl)sucrose.

<31> The composition according to <28>, wherein the radical polymerization initiator is a compound selected from the group consisting of at least one of compounds represented by the following formulae:

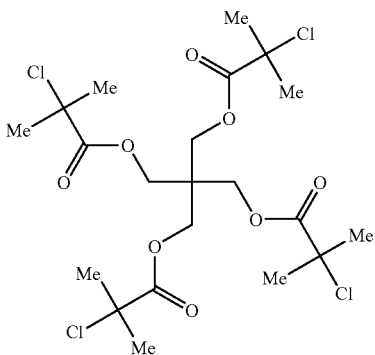

-continued
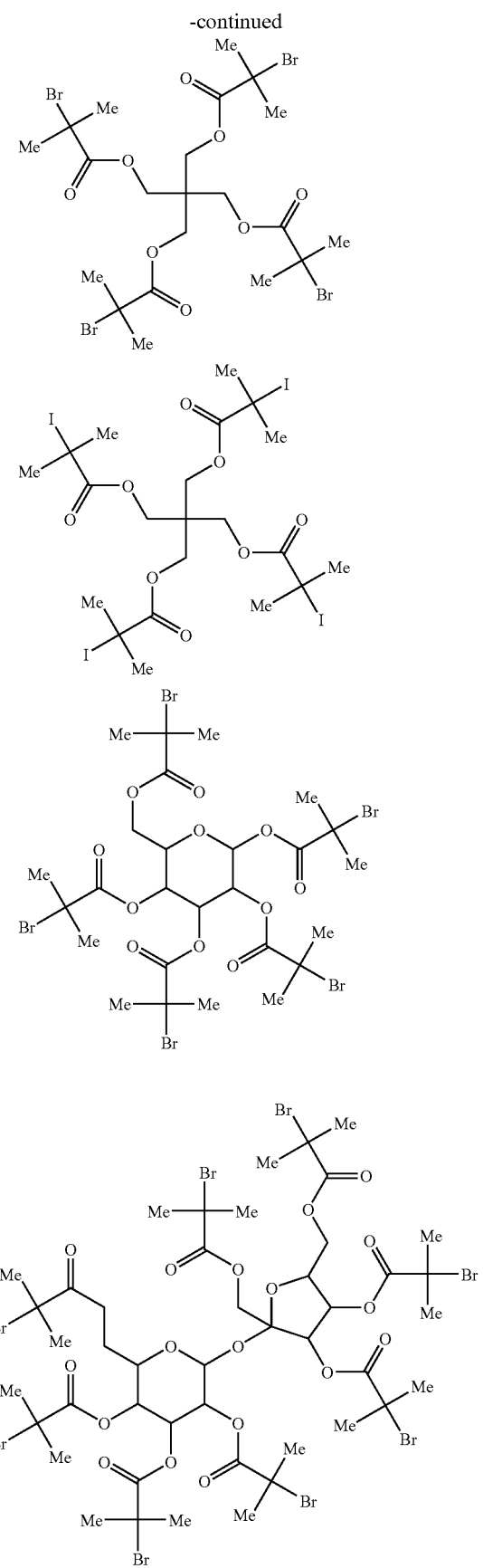
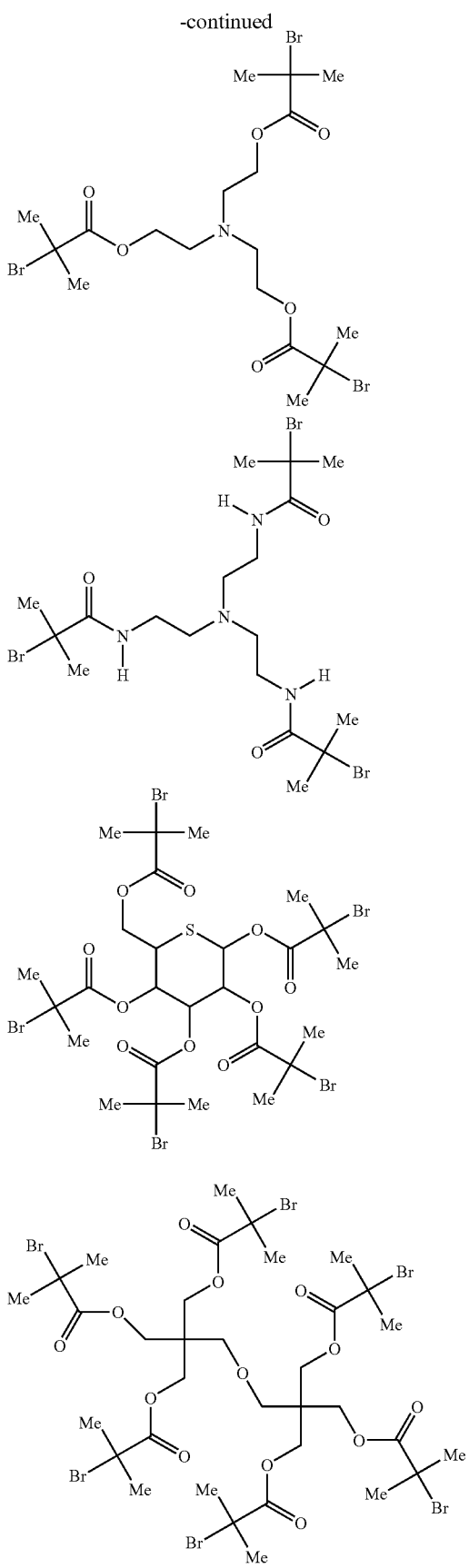

DETAILED DESCRIPTION OF THE INVENTION

The star polymer of the present invention (hereinafter may be referred to as "Star Polymer") has a central core and three or more branches bonded to the central core, and has a weight average molecular weight of from 1,000 to 100,000, and at least one of the branches contains at least one repeating unit selected from the group consisting of the following repeating units (1), (2), (3), (4) and (9);

The formula (1)

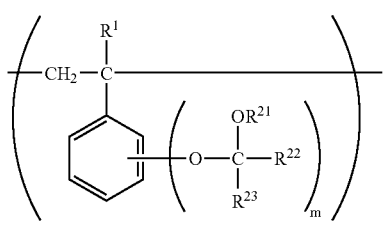

wherein $R^1$ represents a hydrogen atom, an alkyl group having 1 to 4 carbon atoms, or a fluoroalkyl group having 1 to 4 carbon atoms, $R^{21}$ and $R^{22}$ each independently represents an alkyl group having 1 to 6 carbon atoms, a cycloalkyl group having 3 to 6 carbon atoms, a haloalkyl group having 1 to 6 carbon atoms, a halocycloalkyl group having 3 to 10 carbon atoms, or a phenyl group wherein at least one hydrogen atom in the phenyl group may be substituted by an alkyl group having 1 to 4 carbon atom or a halogen atom, or $R^{21}$ and $R^{22}$ bond to form a divalent saturated aliphatic hydrocarbon group having from 5 to 10 carbon atoms, $R^{23}$ represents a hydrogen atom, an alkyl group having 1 to 10 carbon atoms, a cycloalkyl group having 3 to 10 carbon atoms, a haloalkyl group having 1 to 10 carbon atoms, a halocycloalkyl group having 3 to 10 carbon atoms, or an aralkyl group having 7 to 12 carbon atoms, with the proviso that $R^{22}$ is methyl, or the carbon atom in $R^{22}$ linked to the carbon atom adjacent to $R^{22}$ is a secondary or primary carbon atom when $R^{23}$ is a hydrogen atom or the carbon atom in $R^{23}$ linked to the carbon atom adjacent to $R^{22}$ is a tertiary carbon atom, m is an integer of 1 to 3 and when m is 2 or 3, each of the group of the formula $-(OC(OR^{21})R^{22}R^{23})$ may be the same or different.

The formula (2)

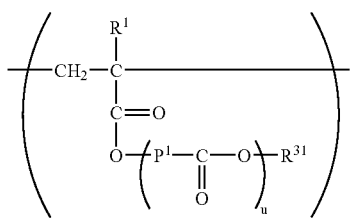

$R^{31}$ represents a hydrocarbon group having 1 to 20 carbon atoms or a group of the formula $-CH(R^{33})-OR^{34}$, u is an integer of 0 to 2, $-CH_2-$ in $R^{31}$ not linked to the oxygen adjacent to $R^{31}$ may be substituted by $-COO-$ or $-O-$, and at least one hydrogen atom in $R^{31}$ may be substituted by a hydroxyl group, a cyano group, a halogen atom or an alkoxy group, $R^{33}$ represents an alkyl group having 1 to 5 carbon atoms or an alicyclic hydrocarbon group having 3 to 10 carbon atoms, $R^{34}$ represents an alkyl group having 1 to 3 carbon atoms, an alicyclic hydrocarbon group having 3 to 10 carbon atoms, a group of the formula $-R^{40}-O-R^{41}$, or a group of the formula $-R^{42}-O(C=O)-R^{43}$ or $R^{33}$ and $R^{34}$ bond to form an divalent saturated aliphatic hydrocarbon group having from 3 to 10 carbon atoms, in the divalent aliphatic hydrocarbon group, $-CH_2-$ not linked to the oxygen adjacent to $R^{31}$ may optionally be substituted by $-COO-$ or $-O-$, $R^{40}$ represents a divalent saturated aliphatic hydrocarbon group having 1 to 5 carbon atoms or a divalent alicyclic hydrocarbon group having 3 to 10 carbon atoms, $R^{41}$ represents an alkyl group having 1 to 5 carbon atoms or an alicyclic hydrocarbon group having 3 to 10 carbon atoms, $R^{42}$ represents a divalent saturated aliphatic hydrocarbon group having 1 to 5 carbon atoms or a divalent alicyclic hydrocarbon group having 3 to 10 carbon atoms, $R^{43}$ represents an alkyl group having 1 to 5 carbon atoms or an alicyclic hydrocarbon group having 3 to 10 carbon atoms.

The formula (3)

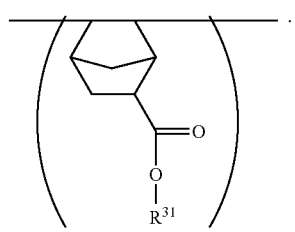

wherein $R^{31}$ has the same meaning as defined above.

The formula (4)

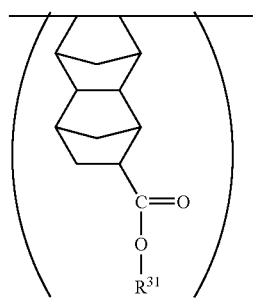

wherein $R^{31}$ has the same meaning as defined above.

The formula (9)

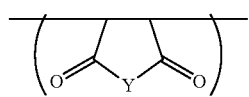

wherein Y represents an oxygen atom or $-NH-$.

The chemically amplified positive resist composition of the present invention comprises a polymer which is Star Polymer and is insoluble or poorly soluble in an alkali aqueous solution but becomes soluble in an alkali aqueous solution by the action of an acid; and an acid generator.

When used for the resist composition, Star Polymer is preferably insoluble or poorly soluble in an alkali aqueous solution but becomes soluble in an alkali aqueous solution by the action of an acid. For having such properties, branches of Star Polymer preferably contains a repeating unit (1), or preferably contains repeating unit (2), (3) or (4) wherein $R^{31}$ is tertiary hydrocarbon group or a group of the formula —CH($R^{33}$)—$OR^{34}$. The content of total of the repeating unit (1) and the repeating units (2), (3) and (4) wherein $R^{31}$ is tertiary hydrocarbon group or a group of the formula —CH($R^{33}$)—$OR^{34}$ is usually 10% by mol or more, and preferebly 20% by mol or more based on total mol of repeating unit in Star Polymer.

The central core in the star polymer of the present invention is preferably a structural unit of the formula (I)

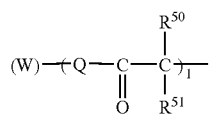

wherein (W) represents a polyvalent aromatic hydrocarbon group, a polyvalent saturated cyclic hydrocarbon group, a polyvalent saturated acyclic hydrocarbon group or a group combined by at least two of the polyvalent aromatic hydrocarbon group, the polyvalent saturated cyclic hydrocarbon group and the polyvalent saturated acyclic hydrocarbon group, wherein at least one —$CH_2$— in the polyvalent saturated cyclic hydrocarbon group and the polyvalent saturated acyclic hydrocarbon group not linked to Q may optionally be substituted by —O—, —S—, —$NR^{52}$— or —$SiR^{53}{}_2$— and at least one hydrogen atom in the polyvalent aromatic hydrocarbon group and the polyvalent saturated cyclic hydrocarbon group may optionally be substituted by an alkyl group having 1 to 6 carbon atoms, $R^{52}$ and $R^{53}$ each independently represents a hydrogen atom or an alkyl group having 1 to 6 carbon atoms, Q represents —O—, —S— or —$NR^{54}$—, wherein $R^{54}$ represents a hydrogen atom or an alkyl group having 1 to 6 carbon atoms, $R^{50}$ and $R^{51}$ each independently represents an alkyl group having 1 to 6 carbon atoms, an alkylalkoxy group having 2 to 6 carbon atoms or a cycloalkyl group having 3 to 12 carbon atoms, or $R^{50}$ and $R^{51}$ link together and represents a divalent saturated aliphatic hydrocarbon group which bonds to form a divalent cyclic hydrocarbon group together with a carbon atom adjacent to $R^{50}$ and $R^{51}$, and 1 represents an integer of 3 to 12.

Examples of (W) include neopentan-tetrayl group, 2,2',2''-nitrilotriethyl group, 2-methyltetrahydropyran-α, 3,4,5,6-pentayl group, 2-methyltetrahydrothiopyran-α, 3,4,5,6-pentayl group, 2,5-dimethyltetrahydrofuran-α, α',2,3,4-pentayl group, and a group combined by at least two of them.

Examples of -Q-CO—C($R^{50}$)($R^{51}$)— include —O—CO—C($CH_3$)$_2$—, —O—CO—C($C_2H_5$)$_2$—, —O—CO—C($C_3H_7$)$_2$—, —O—CO—C($CH_3$)($C_2H_5$)—,

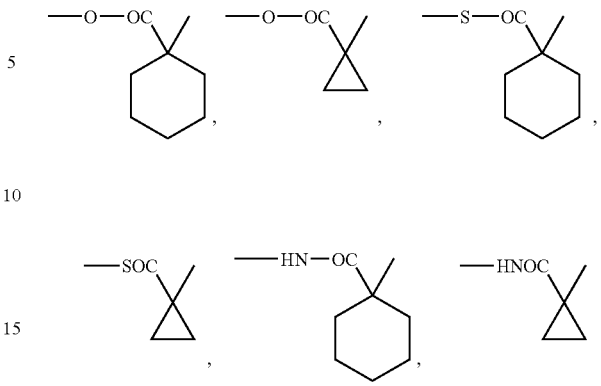

—S—CO—C($CH_3$)$_2$—, —S—CO—C($C_2H_5$)$_2$—, —S—CO—C($C_3H_7$)$_2$—, —S—CO—C($CH_3$)($C_2H_5$)—, —NH—CO—C($CH_3$)$_2$—, —NH—CO—C($C_2H_5$)$_2$—, —NH—CO—C($C_3H_7$)$_2$—, —NH—CO—C($CH_3$)($C_2H_5$)—, —N($CH_3$)—CO—C($CH_3$)$_2$—, and the like.

Specific and preferred examples of the structural unit of the formula (I) include the followings;

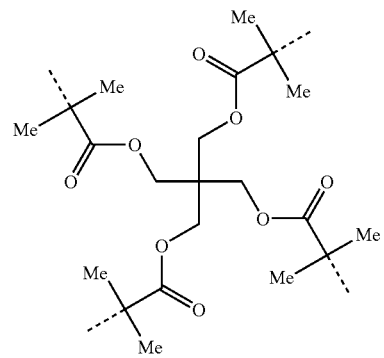

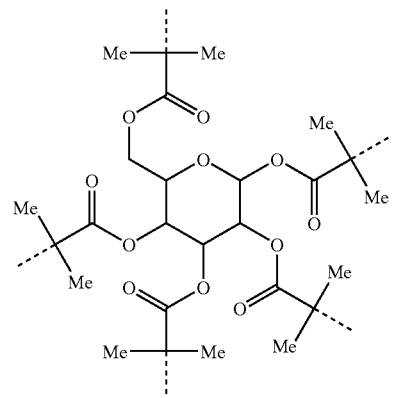

-continued

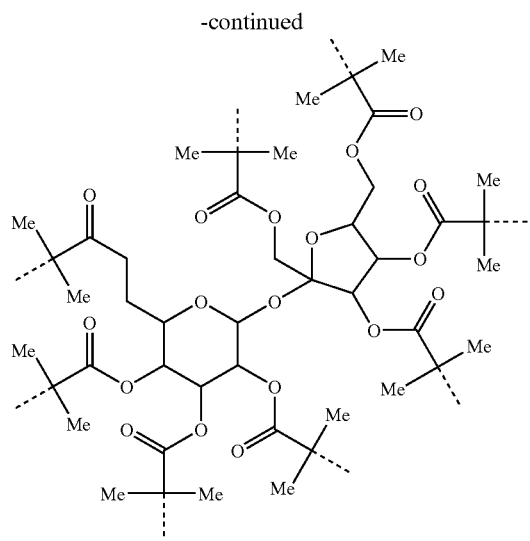

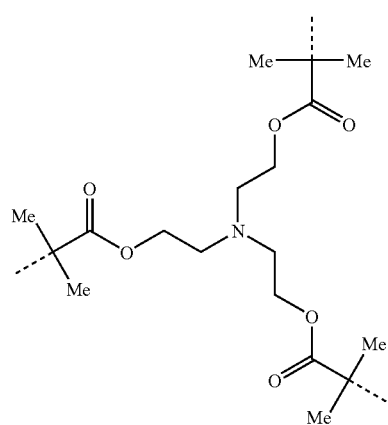

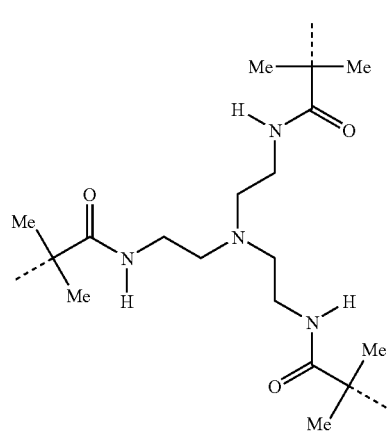

-continued

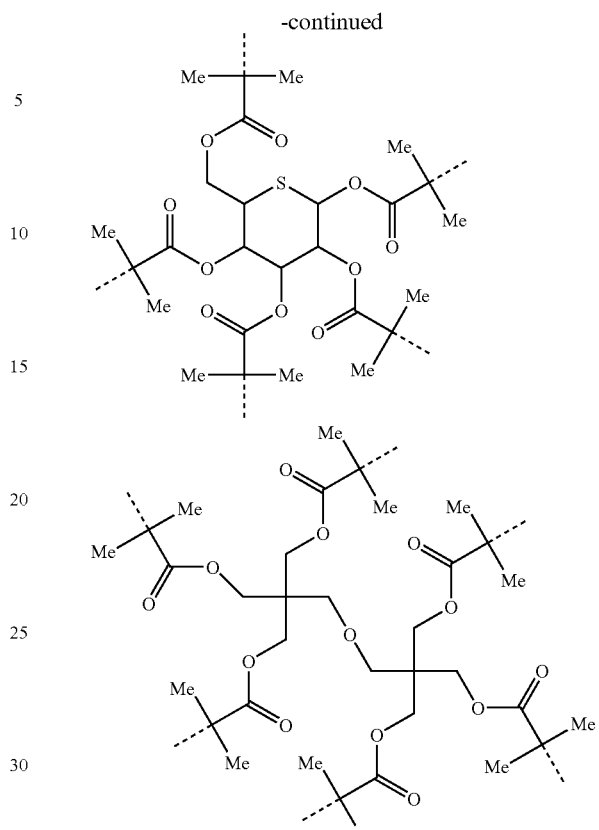

The weight average molecular weight of Star polymer is from 1,000 to 100,000 on polystyrene basis, and preferably from 2,000 to 20,000.

Star Polymer has three or more branches that are bonded to the central core, and preferably has four or more branches. Further, each of the branches has the repeating unit any of structural unit (1), (2), (3), (4) and (9).

The repeating unit (1) in Star Polymer will be explained.

In $R^1$, examples of the alkyl group having from 1 to 4 carbon atoms includes a methyl group, an ethyl group, a propyl group, and a n-butyl group, and is preferably a methyl group.

Examples of the fluoroalkyl group having 1 to 4 carbon atoms includes a fluoromethyl group, a difluoromethyl group, a trifluoromethyl group, a 2,2,2-trifluoroethyl group, a perfluoroethyl group, a perfluorobutyl group, and the like, and is preferably a trifluoromethyl group.

In $R^{21}$ and $R^{22}$, examples of the alkyl group having 1 to 6 carbon atoms include a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a 1-methylpentyl group, a n-hexyl group, and an isohexyl group, and is preferably a methyl group.

Examples of the cycloalkyl having 3 to 6 carbon atoms include a cyclopropyl group, a cyclopentyl group, a cyclohexyl group, and the like, and is preferably a cyclohexyl group.

Examples of the haloalkyl group having 1 to 6 carbon atoms include a fluoromethyl group, a difluoromethyl group, a trifluoromethyl group, a 2,2,2-trifluoroethyl group, a perfluoroethyl group, a perfluorobutyl group, a perfluoro-tertbutyl group, a perfluorohexyl group, and the like, and is preferably a trifluoromethyl group.

Examples of the halocycloalkyl group having 3 to 6 carbon atoms include a perfluorocyclopropyl group, a perfluorocyclopentyl group, a perfluorocyclohexyl group, and the like, and is preferably a perfluorocyclohexyl group.

Examples of the divalent saturated aliphatic hydrocarbon group having 5 to 10 carbon atoms formed by joining of $R^{21}$ and $R^{22}$, which way also be referred to as alkylene group having 5 to 10 carbon atoms, include a pentamethylene group, a hexamethylene group, an octamethylene group, and the like, and is preferably a pentamethylene group.

Examples of the phenyl group in which at least one hydrogen atom of the phenyl may be optionally substituted by alkyl having 1 to 4 carbon atoms or halogen include a phenyl group, a p-tolyl group, a p-chlorophenyl group, and the like, and is preferably a phenyl group.

In $R^{23}$, examples of the alkyl group having 1 to 10 carbon atoms include a methyl group, an ethyl group, a n-propyl group, an isopropyl group, a n-butyl group, an isobutyl group, a tert-butyl group, a sec-butyl group, a n-pentyl group, an isopentyl group, a tert-pentyl group, a 1-methylpentyl group, a n-hexyl group, an isohexyl group, a heptyl group, an octyl group, a nonyl group, a decyl group, and the like, and is preferably a methyl group.

Examples of the cycloalkyl group having 3 to 10 carbon atoms include a cyclopropyl group, a cyclopentyl group, a cyclohexyl group, and a 4-n-butylcyclohexyl group, and is preferably a cyclohexyl group.

Examples of the halo alkyl having 1 to 10 carbon atoms include a fluoromethyl group, a difluoromethyl group, a trifluoromethyl group, a 2,2,2-trifluoroethyl group, a perfluoroethyl group, a perfluorobutyl group, a perfluoro-tert-butyl group, a perfluorooctyl group, a perfluorodecyl group, and the like, and is preferably a trifluoromethyl group.

Examples of the halocycloalkyl group having 3 to 10 carbon atoms include a perfluorocyclopropyl group, a perfluorocyclopentyl group, a perfluorocyclohexyl group, a perfluoro-4-butylcyclohexyl group, and the like, and is preferably a perfluorocyclohexyl group.

The aralkyl having 7 to 12 carbon atoms include a benzyl group, a phenethyl group, a phenylpropyl group, a methylbenzyl group, a methylphenethyl group, an ethylbenzyl, and a ethylnaphthyl group, and is preferably a benzyl group.

Examples of the monomer leading the repeating unit of the formula (1) include p- or m-1-methoxy-1-methylethoxystyrene, p- or m-1-benzyloxy-1-methylethoxystyrene, p- or m-1-benzyloxyethoxystyrene, p- or m-1-ethoxyethoxystyrene, p- or m-1-methoxyethoxystyrene, p- or m-1-n-buthoxyethoxystyrene, p- or m-1-isobuthoxyethoxystyrene, p- or m-1-(1,1-dimethylethoxy)-i-methylethoxystyrene, p- or m-1-(1,1-dimethylethoxy)ethoxystyrene, p- or m-1-(2-chloroethoxy)ethoxystyrene, p- or m-1-(2-ethylhexyloxy)ethoxystyrene, p- or m-1-ethoxy-1-methylethoxystyrene, p- or m-1-n-propoxyethoxystyrene, p- or m-1-methyl-1-n-propoxyethoxystyrene, p- or m-1-methoxypropoxystyrene, p- or m-1-ethoxypropoxystyrene, p- or m-1-methoxybuthoxystyrene, m- or p-1-methoxycyclohexyloxystyrene, m- or p-1-ethoxy-1-cyclohexylmethoxystyrene, p- or m-1-cyclohexyloxyethoxystyrene, p- or m-(α-ethoxybenzyl)oxystyrene, p- or m-[α-ethoxy-(4methylbenzyl)]oxystyrene, p- or m-[α-ethoxy-(4-methoxylbenzyl)]oxystyrene, p- or m-[α-ethoxy-(4-bromobenzyl)]oxystyrene, and p- or m-1-ethoxy-2-methylpropoxystyrene.

The repeating unit (2) in Star Polymer will be explained.

In $R^{31}$, examples of the hydrocarbon group having from 1 to 20 carbon atoms include an alicyclic hydrocarbon group having a bond on a tertiary carbon atom such as a 2-alkyl-2-adamantyl group, a 1-alkylcycloalkyl group, and a 1-(1-adamantyl)-1-alkylalkyl group and tertiary alkyl group (for example a tert-butyl group ); a primary or secondary alkyl group such as a methyl group, an ethyl group, a propyl group, isopropyl group, and the like.

Examples of the 2-alkyl-2-adamantyl group include a 2-methyl-2-adamantyl group, a 2-ethyl-2-adamantyl group, a 2-isopropyl-2-adamantyl group, and a 2-n-butyl-2-adamantyl groups, and the like.

Examples of the 1-alkylcycloalkyl group includes 1-methylcyclopentyl, 1-ethylcyclopentyl, 1-methylcyclohexyl, 1-ethylcyclohexyl, and 1-cyclohexylcyclopentyl groups, and the like.

Examples of the 1-(1-adamantyl)-1-alkylalkyl group includes 1-(1-adamantyl)-1-methylethyl, 1-(1-adamantyl)-1-methylpropyl, 1-(1-adamantyl)-1-ethylpropyl groups, and the like.

Examples of the group represented by $R^{33}$ in —CH($R^{33}$)—O$R^{34}$ include a methyl group, an ethyl group, a cyclopropyl group, a cyclohexyl group, and the like.

Examples of the group represented by $R^{34}$ include a methyl group, an ethyl group, an isopropyl group, a isobutyl group, a cyclopropyl group, a cyclohexyl group, and the like.

Examples of the group represented by —CH($R^{33}$)—O$R^{34}$ include a methoxymethyl group, an ethoxymethyl group, a 1-ethoxyethyl group, a 1-isobutoxyethyl group, a 1-isopropoxyethyl group, a 1-ethoxypropyl group, a 1-(2-methoxyethoxy)ethyl group, a 1-(2-acetoxyethoxy)ethyl group, a 1-[2-(1-adamantyloxy)ethoxy]ethyl group, a 1-[2-(1-adamantanecarbonyloxy)ethoxy]ethyl, tetrahydro-2-furyl group, a tetrahydro-2-pyranyl group, and the like.

When the hydrocarbon group having from 1 to 20 carbon atoms in $R^{31}$ is a 2-alkyl-2-adamantyl group, the repeating unit (2) is represented by the following formula.

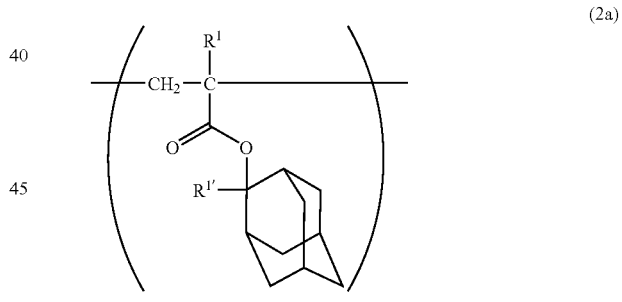

(2a)

wherein $R^1$ has the same meaning as defined above, and $R^{1'}$ represents an alkyl group having from 1 to 4 carbon atoms.

When Star Polymer with the repeating unit (2) that has a bulky group such as alicyclic hydrocarbon having a bond on tertiary carbon atom is used for a resist composition, better resolution is achieved, which is desirable.

Examples of the monomer leading to the repeating unit (2) having such a bulky group includes, for example, 2-alkyl-2-adamantyl(meth)acrylate and 1-(1-adamantyl)-1-alkylalkyl (meth)acrylate.

2-alkyl-2-adamantyl(meth)acrylate is particularly preferred because of excellent resolution in resist. Specific examples of 2-alkyl-2-adamantyl(meth)acrylate include 2-methyl-2-adamantyl acrylate, and 2-methyl-2-adamantyl methacrylate, 2-ethyl-2-adamantyl acrylate, 2-ethyl-2-adamantyl methacrylate, 2-isopropyl-2-adamantyl acrylate, 2-isopropyl-2-adamantyl methacrylate, 2-n-butyl-2-adamantyl acrylate, and 2-n-butyl-2-adamantyl methacrylate.

Among them, particularly 2-ethyl-2-adamantyl(meth)acrylate is desirable for adhesiveness of resist to substrate and enhancement of resolution, and 2-ethyl-2-adamantyl methacrylate (leading to the repeating unit illustrated below) is preferred because it shows especially high adhesiveness of resist to substrate.

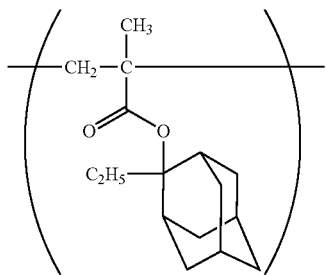

(2a-1)

If necessary, another monomer having a group that is cleaved by the action of an acid may be used in combination.

2-Alkyl-2-adamantyl (meth)acrylate can usually be produced by a reaction between 2-alkyl-2-adamantanol or its metal salt and acryloyl halide or mathacryloyl halide. For example, the reaction of 2-adamantanone with ethyllithium produces lithium 2-ethyl-2-adamantanolate, which is then condensed with methacryloyl halide to obtain 2-ethyl-2-adamantyl methacrylate.

Next, the repeating unit (3) in Star Polymer will be explained.

A preferred $R^{31}$ in the repeating unit (3) is the one that has a bulky group such as alicyclic hydrocarbon group having a bond on tertiary carbon atom.

Examples of a monomer leading to the repeating unit (3) having such a bulky group include 2-alkyl-2-adamantyl 5-norbornene-2-carboxylate and 1-(1-adamantyl)-1-alkylalkyl 5-norbornene-2-carboxylate.

Examples of the 2-alkyl-2-adamantyl 5-norbornene-2-carboxylate include 2-methyl-2-adamantyl 5-norbornene-2-carboxylate, 2-ethyl-2-adamantyl 5-norbornene-2-carboxylate, 2-isopropyl-2-adamantyl 5-norbornene-2-carboxylate, and the like.

Examples of the 1-(1-adamantyl)-1-alkylalkyl 5-norbornene-2-carboxylate include 1-(1-adamantyl)-1-methylethyl 5-norbornene-2-carboxylate, 1-(1-adamantyl)-1-methylpropyl 5-norbornene-2-carboxylate, 1-(1-adamantyl)-1-ethylpropyl 5-norbornene-2-carboxylate, and the like.

Next, the repeating unit (4) in Star Polymer will be explained.

A preferred $R^{31}$ in the repeating unit (4) is the one that has a bulky group such as alicyclic hydrocarbon group having a bond on tertiary carbon atom.

Examples of a monomer leading to the repeating unit (4) having such a bulky group can include 2-alkyl-2-adamantyl 3-tetracyclododecene-8-carboxylate and 1-(1-adamantyl)-1-alkylalkyl 3-tetracyclododecene-8-carboxylate.

Examples of the 2-alkyl-2-adamantyl 3-tetracyclododecene-8-carboxylate includes 2-methyl-2-adamantyl 3-tetracyclododecene-8-carboxylate, 2-ethyl-2-adamantyl 3-tetracyclododecene-8-carboxylate, 2-isopropyl-2-adamantyl 3-tetracyclododecene-8-carboxylate, and the like.

Examples of the 1-(1-adamantyl)-1-alkylalkyl 3-tetracyclododecene-8-carboxylate include 1-(1-adamantyl)-1-methylethyl 3-tetracyclododecene-8-carboxylate, 1-(1-adamantyl)-1-methylpropyl 3-tetracyclododecene-8-carboxylate, 1-(1-adamantyl)-1-ethylpropyl 3-tetracyclododecene-8-carboxylate, and the like.

The repeating unit (9) in Star Polymer will be explained.

Example of the monomer leading to the repeating unit of the formula (9) is maleic anhydride when Y is oxygen, and is maleimide when Y is —NH—.

Star Polymer may have, on its branches, a repeating unit derived from 3-hydroxy-1-adamantyl(meth)acrylate, a repeating unit derived from α-methacryloyloxy-γ-butyrolactone, a repeating unit derived from norbornane lactone methacrylate (hereinafter, may also be referred to as NLM), or a repeating unit derived from norbornane lactone acrylate (hereinafter, may also be referred to as NLA).

Any repeating units containing lactones are high in polarity, and the presence of any one of them on the branches of Star Polymer contributes to enhancement of adhesiveness of a resist containing the polymer to a substrate.

Among them, a resist composition containing Star Polymer having the repeating unit derived from α-methacryloyloxy-γ-butyrolactone has an excellent effect on enhancement of adhesiveness to a substrate, and further, a resist composition containing Star Polymer also having the repeating unit derived from 2-ethyl-2-adamantyl methacrylate has a more striking effect thereof.

Further, a resist composition containing Star Polymer having a repeating unit derived from 2-alkyl-2-adamantyl(meth)acrylate and a repeating unit derived from 3-hydroxy-1-adamantyl(meth)acrylate has a remarkable effect on enhancement of adhesiveness to a substrate.

Furthermore, among the above repeating units, a resist composition containing Star Polymer having a repeating unit derived from 3-hydroxy-1-adamantyl(meth)acrylate also contributes to improvement in resistance to dry etching of the resist, and a resist composition containing Star Polymer having the repeating units derived from 3-hydroxy-1-adamantyl (meth)acrylate and α-methacryloyloxy-γ-butyrolactone also contribute to enhancement of resolution of the resist.

The repeating unit derived from 3-hydroxy-1-adamantyl (meth)acrylate means a unit of the following formula (6a) that is formed by polymerization of 3-hydroxy-1-adamantyl (meth)acrylate.

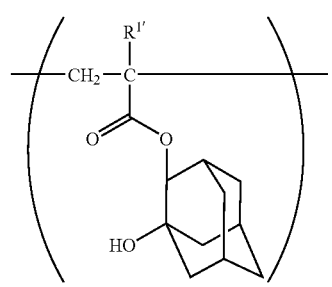

(6a)

In the formula (6a), $R^{1'}$ represents a hydrogen atom or a methyl group.

The repeating unit derived from α-(meth)acryloyloxy-γ-butyrolactone means a unit of the following formula (6b) that is formed by polymerization of α-(meth)acryloyloxy-γ-butyrolactone.

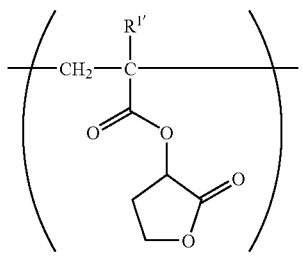

(8b)

In the formula (6a), $R^{1'}$ has the same meaning as defined above.

The repeating unit derived from NLM or NLA means a unit that is formed by polymerization of NLA or NLM and is represented by the following formula (6c), respectively. In the formula (6c), it is NLM when $R^1$ is methyl, and NLA when $R^1$ is hydrogen.

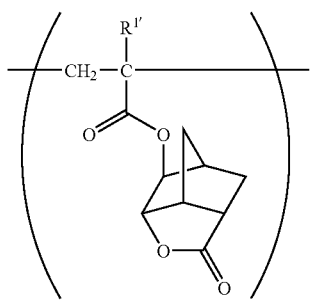

(6c)

In the formula (6c), $R^{1'}$ has the same meaning as defined above.

Star Polymer may have other repeating units, for example, a repeating unit derived from alkylcyclohexyl (meth)acrylate. Here, the repeating unit derived from alkylcyclohexyl (meth)acrylate means a repeating unit that is formed by polymerization of alkylcyclohexyl (meth)acrylate and is represented by the following formula (2b).

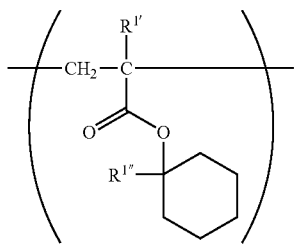

(2b)

In the formula (2b), $R^{1'}$ has the same meaning as defined above, and $R^{1''}$ represents an alkyl group having 1 to 4 carbon atoms.

A monomer leading to the repeating unit represented by the formula (2b) includes methylcyclohexyl acrylate, methylcyclohexyl methacrylate, ethylcyclohexyl acrylate, ethylcyclohexyl methacrylate, isopropylcyclohexyl acrylate, isopropylcyclohexyl methacrylate, n-butylcyclohexyl acrylate, n-butylcyclohexyl methacrylate, and the like.

The repeating units represented by formulae (6a), (6b) and (6c) are contained in a resin as appropriate for the purpose that the side wall shape of a resist is improved by restraining the developing rate of exposed portions, an influence of the proximity effect is reduced, and mask linearity is improved.

Star Polymer can be obtained by a process comprising reacting a radical polymerization initiator of the following formula (10)

$$Z\text{-}T_p \qquad (10)$$

wherein Z represents a central core, T represents a radically transferable atom or group, and p represents an integer of 3 or more, and each of T may be the same or different, with a monomer leading to a repeating unit of at least one of the formulae (1), (2), (3), (4) and (9) by atom transfer radical polymerization in the presence of a catalytically effective amount of an oxidizable transition metal complex catalyst.

Z in the radical polymerization initiator constitutes the central core of Star Polymer after the reaction.

The radical polymerization initiator is preferably a compound obtained by acylating a compound of 3 to 100 carbon atoms having three or more groups in total selected from the group consisting of hydroxyl group, thiol group, and N-alkylamino group with an acylating agent having a radically transferable atom or group, and —$CH_2$— in the compound may be optionally substituted by oxygen atom, sulfur atom, —NH—, or —$SiH_2$—.

The radical polymerization initiator is more preferably a compound selected from the group consisting of a compound obtained by acylating a polyhydric alcohol of 3 to 100 carbon atoms having three or more hydroxyl groups with an acylating agent having a radically transferable atom or group, a compound obtained by acylating a polythioalcohol of 3 to 100 carbon atoms having three or more thiol groups with an acylating agent having a radically transferable atom or group, and a compound obtained by acylating a polyamine of 3 to 100 carbon atoms having three or more N-alkylamino groups with an acylating agent having a radically transferable atom or group, and —$CH_2$— in these compounds may be optionally substituted by oxygen atom, sulfur atom, —NH—, or —$SiH_2$—, The radical polymerization initiator includes, for example, the following compounds.

The compound obtained by acylating a polyhydric alcohol of 3 to 100 carbon atoms having three or more hydroxyl groups with an acylating agent having a radically transferable atom or group includes a compound in which hydroxyl groups of a polysaccharide or monosaccharide are acylated such as per(2-bromoisobutyryl)cyclodextrin, per(2-bromoisobutyryl)maltotriose, or tetrakis(2-bromoisobutyryl)arabinose; a compound in which hydroxyl groups of a cycloalkylpolyol or alkylpolyol are acylated such as tris(2-bromoisobutyryl)cyclohexanetriol, tetrakis(2-bromoisobutyryl)pentaerythritol, or hexa(2-bromoisobutyryl)mannitol; a compound in which hydroxyl groups of a polyhydric amine are acylated such as tris(2-bromoisobutyryl)triethanolamine; a compound in which hydroxyl groups of an aromatic ring are acylated such as tris(2-bromoisobutyryl)benzenetriol or tris (2-bromoisobutyryl)trihydroxypyrimidine, and the like.

The compound obtained by acylating a polythioalcohol of 3 to 100 carbon atoms having three or more thiol groups with an acylating agent having a radically transferable atom or group includes a compound in which hydroxyl groups of an alkylpolythiol are acylated such as tetrakis(2-bromoisobutyryl)pentaerythrithiol or tetrakis(2-bromoisobutyryl)2,2-bis (mercaptomethyl)-1,4,butanedithiol and the like.

The compound obtained by acylating a polyamine of 3 to 100 carbon atoms having three or more N-alkylamino groups with an acylating agent having a radically transferable atom or group includes a compound in which amino groups of an alkylamine are acylated such as tetrakis(2-bromoisobutyryl) spermine or tris(2-bromoisobutyryl)spermidine, and the like.

Preferred examples of the radical polymerization initiators include tetrakis(2-bromoisobutyryl)pentaerythritol, pentakis (2-bromoisobutyryl)glucose, octakis(2-bromoisobutyryl)sucrose, octadecakis(2-bromoisobutyryl)-α-cyclodextrin, tetracosakis(2-bromoisobutyryl)-γ-cyclodextrin, hexakis(2-bromoisobutyryl)dipentaerythritol,

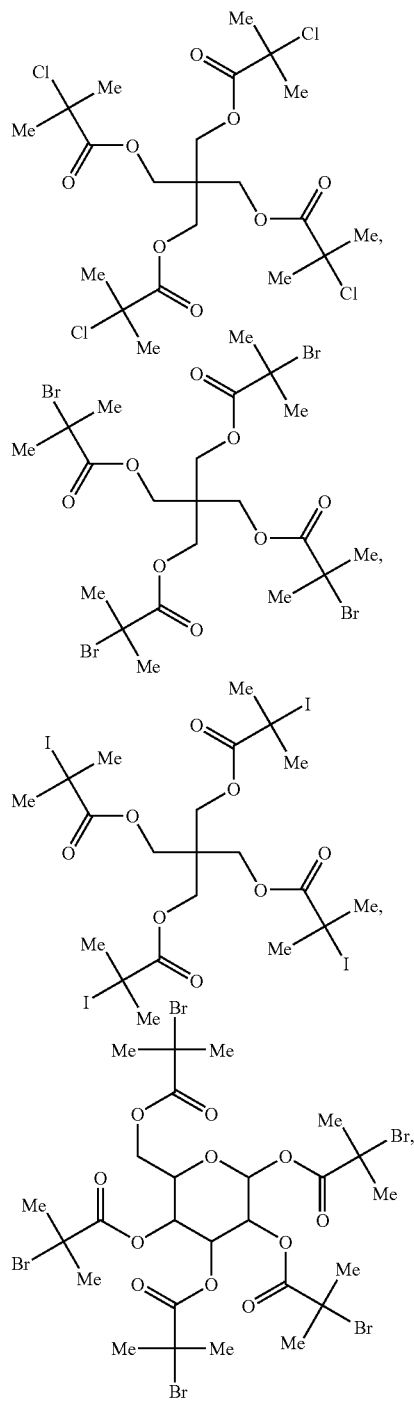

-continued

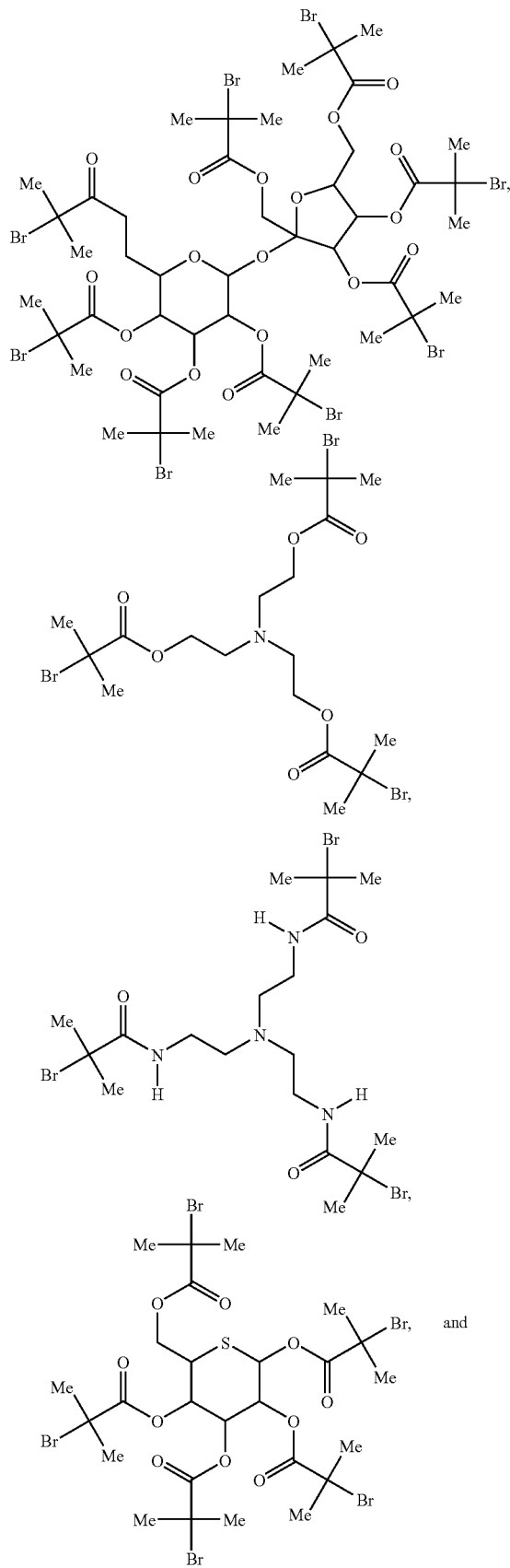

-continued

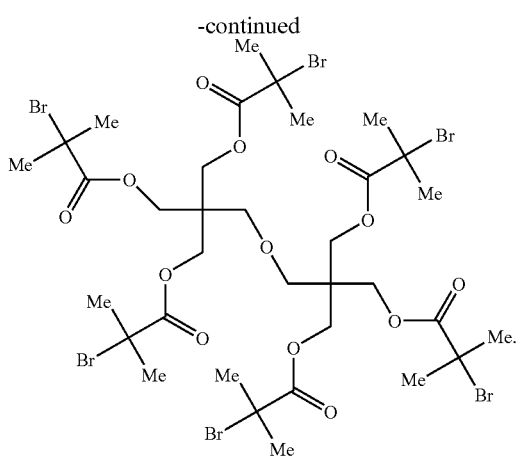

Examples of the transition metal used for the oxidizable transition metal complex catalyst used in the process for producing Star Polymer include Cu, Ni, Pd, Pt, Rh, Co, Ir, Fe, Ru, Os, Re, and Mn, preferably Cu, Ru, Fe, and Ni, and more preferably Cu.

Examples of coordination atoms to the metal of the oxidizable transition metal complex catalyst used in the process for producing Star Polymer include nitrogen atom, oxygen atom, phosphorus atom, sulfur atom, and the like, and preferably nitrogen atom or phosphorus atom.

Specific examples of ligands include 2,2'-bipyridyl and its derivatives, 1,10-phenanthroline and its derivatives, tetramethylethylenediamine, pentamethyldiethylenetriamine, hexamethylenetriethylenetetramine, tris(dimethylaminoethyl) amine, triphenylphosphine, tributylphosphine, and the like.

The amount of the oxidizable transition metal complex catalyst to be used is usually from 0.5 to 100% by mol, and preferably from 10 to 100% by mol with respect to the mol of radical polymerization initiator/number of branches.

The star polymer of the present invention can be produced by copolymerizing the above-described monomers, for example, 2-alkyl-2-adamantyl(meth)acrylate, 3-hydroxy-1-adamantyl(meth)acrylate, α-methacryloyloxy-γ-butyrolactone, NLM, NLA, and alkylcyclohexyl (meth)acrylate using the oxidizable transition metal complex as the catalyst and the polymerization initiator.

Proper solvent can be used in the polymerization. Inert organic solvents such as dioxane, methyl isobutyl ketone, toluene, xylene, tetrahydrofuran, or anisole, or a mixture thereof are usually used. Further, when a water-insoluble solvent is used, it is also possible to polymerize in a suspension polymerization system by adding water as well as in a bulk polymerization system without using any solvent.

The temperature for polymerization to produce the star polymer of the present invention is usually in the range of 0 to 200° C., and preferably in the range of 50 to 100° C.

Although the molar ratio of addition of a monomer to a central core varies depending on the molecular weight of Star Polymer to be targeted, it is usually in the range of 20 to 10,000, and preferably in the range of 40 to 1,000.

The method for purification of the obtained Star Polymer is not particularly limited. However, crystallization is preferred in view of monomer removal, and a combination of liquid-liquid phase separation, washing, and the like is preferred in view of metal catalyst removal.

The chemically amplified positive resist composition of the present invention is characterized in that it contains Star Polymer and an acid generator.

At least one of the branches preferably contains at least one repeating unit selected from the group consisting of the repeating units (1), (2), (3) and (4).

Star Polymer that does not contain the repeating unit (1) is preferably used for a resist for ArF excimer laser, KrF excimer laser, or $F_2$ laser.

Star Polymer used for the resist composition of the present invention is selected depending on the kind of radiation used for patterning and the kind of group cleaved by the action of an acid. In general, it is preferred to contain repeating units having a group cleaved by the action of an acid in the range of 20 to 80% by mol.

It is advantageous that particularly the repeating unit derived from 2-alkyl-2-adamantyl (meth)acrylate, preferably the repeating unit derived from 2-ethyl-2-adamantyl (meth) acrylate, as the group cleaved by the action of an acid is set to 20% by mol or higher in the whole repeating units.

When Star Polymer having the repeating unit derived from 2-ethyl-2-adamantyl methacrylate contains additional repeating units other than the repeating unit, it is preferred that the repeating unit derived from 2-ethyl-2-adamantyl methacrylate is set to 10% by mol or higher with respect to the whole repeating units and the total of other repeating units including this unit is set to from 20 to 80% by mol in the whole resin.

It is preferred that repeating units selected from the group consisting of the repeating unit derived from 3-hydroxy-1-adamantyl(meth)acrylate, the repeating unit derived from α-methacryloyloxy-γ-butyrolactone, the repeating unit derived from NLM, the repeating unit derived from NLA, and the repeating unit derived from alkylcyclohexyl(meth)acrylate are present in Star Polymer in the range of 20 to 80% by mol in total.

In the present invention, it is preferred that when Star Polymer contains the repeating unit derived from 2-alkyl-2-adamantyl (meth)acrylate and further any one of the repeating unit derived from 3-hydroxy-1-adamantyl(meth)acrylate and the repeating unit derived from α-methacryloyloxy-γ-butyrolactone or both, any one of the repeating unit derived from 3-hydroxy-1-adamantyl (meth)acrylate and the repeating unit derived from α-methacryloyloxy-γ-butyrolactone or both are set to 20% by mol or higher in total.

The acid generator, another component of the present composition, is the compound which is decomposed to generate an acid by allowing radioactive ray such as light and electron beam to act on the acid generator itself or a resist composition containing the acid generator. The acid generated from the acid generator acts on Star Polymer, to dissociate acid-labile group present in Star Polymer.

Such acid generators include, for example, onium salt, organic halogen compounds, sulfone compounds, sulfonate compounds, and the like Specific examples thereof include the followings:
diphenyliodonium trifluoromethanesulfonate,
4-methoxyphenylphenyliodinium hexafluoroantimonate,
4-methoxyphenylphenyliodinium trifluoromethanesulfonate,
bis(4-tert-butylphenyl)iodonium tetrafluoroborate
bis(4-tert-butylphenyl)iodonium hexafluorophosphate,
bis(4-tert-butylphenyl)iodonium hexafluoroantimonate
bis(4-tert-butylphenyl)iodonium trifluoromethanesulfonate,
triphenylsulfonium hexafluorophosphate,
triphenylsulfonium hexafluoroantimonate,
triphenylsulfonium trifluoromethanesulfonate, triphenylsulfonium adamantanemethoxycarbonyldifluoromethylsulfonate,
triphenylsulfonium 1-(3-hydroxymethyladamantane)methoxycarbonyldifluoromethanesulfonate,
triphenylsulfonium 1-(hexahydro-2-oxo-3,5-methano-2H-cyclopenta[b]furan-6-yloxycarbonyl)difluoromethanesulfonate,
triphenylsulfonium 4-oxo-1-adamantyloxycarbonyldifluoromethanesulfonate,
4-methoxyphenyldiphenylsulfonium hexafluoroantimonate,
4-methoxyphenyldiphenylsulfonium trifluoromethanesulfonate,
p-tolyldiphenylsulfonium trifluoromethanesulfonate,
p-tolyldiphenylsulfonium perfluorobutanesulfonate,
p-tolyldiphenylsulfonium perfluorooctanesulfonate,
2,4,6-trimethylphenyldiphenylsulfonium trifluoromethanesulfonate,
4-tert-butylphenyldiphenylsulfonium trifluoromethanesulfonate,
4-phenylthiophenyldiphenylsulfonium hexafluorophosphate,
4-phenylthiophenyldiphenylsulfonium hexafluoroantimonate,
1-(2-naphtholylmethyl)thiolanium hexafluoroantimonate,
1-(2-naphtholylmethyl)thiolanium trifluoromethanesulfonate,
4-hydroxy-1-naphthyldimethylsulfonium hexafluoroantimonate,
4-hydroxy-1-naphthyldimethylsulfonium trifluoromethanesulfonate,
cyclohexylmethyl(2-oxocyclohexyl)sulfonium trifluoromethanesulfonate,
cyclohexylmethyl(2-oxocyclohexyl)sulfonium perfluorobutanesulfonate,
cyclohexylmethyl(2-oxocyclohexyl)sulfonium perfluorooctanesulfonate,
2-oxo-2-phenylethylthiacyclopentanium trifluoromethanesulfonate,
2-oxo-2-phenylethylthiacyclopentanium perfluorobutanesulfonate,
2-oxo-2-phenylethylthiacyclopentanium perfluorooctanesulfonate,
2-methyl-4,6-bis(trichloromethyl)-1,3,5-triazine,
2,4,6-tris(trichloromethyl)-1,3,5-triazine
2-phenyl-4,6-bis(trichloromethyl)-1,3,5-triazine,
2-(4-chlorophenyl)-4,6-bis(trichloromethyl)-1,3,5-triazine,
2-(4-methoxyphenyl)-4,6-bis(trichloromethyl)-1,3,5-triazine,
2-(4-methoxy-1-naphthyl)-4,6-bis(trichloromethyl)-1,3,5-triazine,
2-(benzo[d][1,3]dioxolan-5-yl)-4,6-bis(trichloromethyl)-1,3,5-triazine,
2-(4-methoxystyryl)-4,6-bis(trichloromethyl)-1,3,5-triazine,
2-(3,4,5-trimethoxystyryl)-4,6-bis(trichloromethyl)-1,3,5-triazine,
2-(3,4-dimethoxystyryl)-4,6-bis(trichloromethyl)-1,3,5-triazine,
2-(2,4-dimethoxystyryl)-4,6-bis(trichloromethyl)-1,3,5-triazine,
2-(2-methoxystyryl)-4,6-bis(trichloromethyl)-1,3,5-triazine,
2-(4-butoxystyryl)-4,6-bis(trichloromethyl)-1,3,5-triazine,
2-(4-pentyloxystyryl)-4,6-bis(trichloromethyl)-1,3,5-triazine,
1-benzoyl-1-phenylmethyl p-toluenesulfonate (generally called "benzoin tosylate"),
2-benzoyl-2-hydroxy-2-phenylethyl p-toluenesulfonate (generally called α-methylolbenzoin tosylate),
1,2,3-benzene-tri-yl tris(methanesulfonate),
2,6-dinitrobenzyl p-toluenesulfonate,
2-nitrobenzyl p-toluenesulfonate,
4-nitrobenzyl p-toluenesulfonate,
diphenyl disulfone,
di-p-tolyl disulfone
bis(phenylsulfonyl)diazomethane,
bis(4-chlorophenylsulfonyl)diazomethane,
bis(p-tolylsulfonyl)diazomethane,
bis(4-tert-butylphenylsulfonyl)diazomethane,
bis(2,4-xylylsulfonyl)diazomethane,
bis(cyclohexylsulfonyl)diazomethane,
(benzoyl)(phenylsulfonyl)diazomethane,
N-(phenylsulfonyloxy)succinimide,
N-(trifluoromethylsulfonyloxy)succinimide,
N-(trifluoromethylsulfonyloxy)phthalimide,
N-(trifluoromethylsulfonyloxy)-5-norbornene-2,3-dicarboxyimide,
N-(trifluoromethylsulfonyloxy)naphthalimide,
N-(10-camphorsulfonyloxy)naphthalimide, and the like.

In the present composition, performance deterioration caused by inactivation of acid which occurs due to post exposure delay can be diminished by adding basic compounds, particularly, basic nitrogen-containing organic compounds, for example, amines as a quencher.

Specific examples of such basic nitrogen-containing organic compounds include the ones represented by the following formulas.

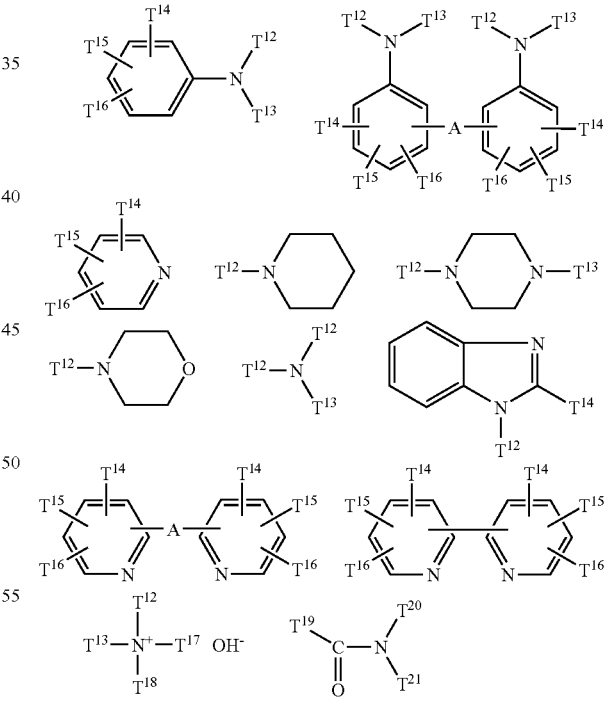

[3]

In the formulas, $T^{12}$ and $T^{13}$ each independently represents a hydrogen atom, an alkyl group, a cycloalkyl group or an aryl group. The alkyl group preferably has about 1 to 6 carbon atoms, the cycloalkyl group preferably has about 5 to 10 carbon atoms, and the aryl group preferably has about 6 to 10 carbon atoms. Furthermore, at least one hydrogen atom on the alkyl group, cycloalkyl group or aryl group may each independently be substituted with hydroxyl group, amino group, or alkoxy group having 1 to 6 carbon atoms. At least one hydrogen atom on the amino group may each independently be substituted with alkyl group having 1 to 4 carbon atoms.

$T^{14}$, $T^{15}$ and $T^{16}$ each independently represents a hydrogen atom, an alkyl group, a cycloalkyl group, an aryl group or an alkoxy group. The alkyl group preferably has about 1 to 6 carbon atoms, the cycloalkyl group preferably has about 5 to 10 carbon atoms, the aryl group preferably has about 6 to 10 carbon atoms, and the alkoxy group preferably has about 1 to 6 carbon atoms. Furthermore, at least one hydrogen atom on the alkyl group, cycloalkyl group, aryl group or alkoxy group may each independently be substituted with hydroxyl group, amino group, or alkoxy group having 1 to 6 carbon atoms. At least one hydrogen atom on the amino group may be substituted with alkyl group having 1 to 4 carbon atoms.

$T^{17}$ represents an alkyl group or a cycloalkyl group. The alkyl group preferably has about 1 to 6 carbon atoms, and the cycloalkyl group preferably has about 5 to 10 carbon atoms. Furthermore, at least one hydrogen atom on the alkyl group or cycloalkyl group may each independently be substituted with hydroxyl group, amino group, or alkoxy group having 1 to 6 carbon atoms. At least one hydrogen atom on the amino group may be substituted with alkyl group having 1 to 4 carbon atoms.

In the formulas, $T^{18}$ represents an alkyl group, a cycloalkyl group or an aryl group. The alkyl group preferably has about 1 to 6 carbon atoms, the cycloalkyl group preferably has about 5 to 10 carbon atoms, and the aryl group preferably has about 6 to 10 carbon atoms. Furthermore, at least one hydrogen atom on the alkyl group, cycloalkyl group or aryl group may each independently be substituted with a hydroxyl group, an amino group, or an alkoxy group having 1 to 6 carbon atoms, At least one hydrogen atom on the amino group may each independently be substituted with alkyl group having 1 to 4 carbon atoms.

However, none of $T^{12}$ and $T^{13}$ in the compound represented by the above formula [3] is a hydrogen atom.

A represents an alkylene group, a carbonyl group, an imino group, a sulfide group or a disulfide group. The alkylene group preferably has about 2 to 6 carbon atoms.

Moreover, among $T^{12}$-$T^{18}$, in regard to those which can be straight-chained or branched, either of these may be permitted.

$T^{19}$, $T^{20}$ and $T^{21}$ each independently represents a hydrogen atom, an alkyl group having 1 to 6 carbon atoms, an aminoalkyl group having 1 to 6 carbon atoms, a hydroxyalkyl group having 1 to 6 carbon atoms or a substituted or unsubstituted aryl group having 6 to 20 carbon atoms, or $T^{19}$ and $T^{20}$ bond to form an alkylene group which forms a lactam rig together with adjacent —CO—N—.

Examples of such compounds include hexylamine, heptylamine, octylamine, nonylamine, decylamine, aniline, 2-, 3- or 4-methylaniline, 4-nitroaniline, 1- or 2-naphtylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptylamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, N,N-dimethylaniline, 2,6-isopropylaniline, imidazole, pyridine, 4-methylpyridine, 4-methyimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(2-pyridyloxy)ethane, 4,4'-dipyridyl sulfide, 4,4'-dipyridyl disulfide, 1,2-bis(4-pyridyl)ethylene, 2,2'-dipicolylamine, 3,3'-dipicolylamine, tetramethylammonium hydroxide, tetraisopropylammonium hydroxide, tetrabutylammonium hydroxide, tetra-n-hexylammonium hydroxide, tetra-n-octylammonium hydroxide, phenyltrimethylammonium hydroxide, 3-trifluoromethylphenyltrimethylammonium hydroxide, (2-hydroxyethyl)trimethylammonium hydroxide (so-called "choline"), N-methylpyrrolidone, dimethylimidazole, and the like.

Furthermore, hindered amine compounds having piperidine skeleton as disclosed in JP-A-H11-52575 can be used as quencher.

It is preferable that the present composition contains Star Polymer in an amount of about 80 to 99.9% by weight and the acid generator in an amount of 0.1 to 20% by weight based on the weight of total solid content of the present composition.

When basic compound is used as a quencher, the basic compound is contained preferably in an amount of about 0.001 to 1% by weight, more preferably in an amount of about 0.01 to 0.3% by weight based on the weight of total solid content of the present composition.

The present composition can contain, if necessary, various additives in small amount such as a sensitizer, solution suppressing agent, other resins, surfactant, stabilizer, dye and the like, as long as the effect of the present invention is not prevented.

The present composition is usually in the form of a resist liquid composition in which the aforementioned ingredients are dissolved in a solvent, and the resist liquid composition is to be applied onto a substrate such as a silicon wafer by a conventional process such as spin coating. The solvent used here is sufficient to dissolve the aforementioned ingredients, have an adequate drying rate, and give a uniform and smooth coat after evaporation of the solvent and, hence, solvents generally used in the art can be used. In the present invention, the total solid content means total content exclusive of solvents in the present composition.

Examples thereof include glycol ether esters such as ethyl Cellosolve acetate, methyl Cellosolve acetate and propylene glycol monomethyl ether acetate; ethers such as di(ethylene glycol) dimethyl ether; esters such as ethyl lactate, butyl lactate, amyl lactate and ethyl pyruvate and the like; ketones such as acetone, methyl isobutyl ketone, 2-heptanone and cyclohexanone; cyclic esters such as γ-butyrolactone, and the like. These solvents can be used each alone or in combination of two or more.

A resist film applied onto the substrate and then dried is subjected to exposure for patterning, then heat-treated for facilitating a deblocking reaction, and thereafter developed with an alkali developer. The alkali developer used here may be any one of various alkaline aqueous solutions used in the art, and generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended Claims, and includes all variations of the equivalent meanings and ranges to the Claims.

The present invention will be described more specifically by way of examples, which are not construed to limit the scope of the present invention. The "%" and "part(s)" used to represent the content of any component and the amount of any material used in the following examples are on a weight basis unless otherwise specifically noted. The weight-average molecular weight of any material used in the following examples is a value found by gel permeation chromatography using styrene as a standard reference material.

MONOMER SYNTHESIS EXAMPLE 1

Synthesis of 2-methyl-2-adamantyl methacrylate

After charging 83.1 g of 2-methyl-2-adamantanol and 101 g of triethylamine, 200 g of methyl isobutyl ketone was added to make a solution. To this solution, 78.4 g of methacryloyl chloride (1.5-fold molar excess relative to 2-methyl-2-adamantanol) was dropped and then stirred for about 10 hours at room temperature.

After filtration, the organic layer was washed with a 5% by weight aqueous solution of sodium bicarbonate, followed by washing twice with water. The organic layer was concentrated and then distilled in vacuo to afford 2-methyl-2-adamantyl methacrylate represented by the following formula in a yield of 75%.

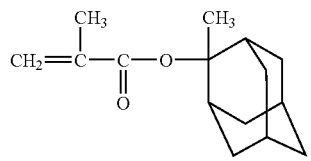

MONOMER SYNTHESIS EXAMPLE 2

Synthesis of 2-ethyl-2-adamantyl methacrylate

To 31.1 g of 2-adamantanone, 50 g of diethyl ether was added to make a solution. While maintaining this solution at a temperature lower than 10° C., 200 ml of a diethyl ether solution containing ethyllithium at a concentration of 1.14 mol/L was dropped into the solution. After stirring as it stands for 2 hours at 0° C., 26.2 g of methacryloyl chloride (1.2-fold molar excess relative to 2-adamantanone) was dropped while keeping the temperature lower than 10 degrees C.

After the dropping, stirring was continued for about 12 hours at room temperature. Then, precipitated inorganic salts were filtered off, and the organic layer was washed with a 5% by weight aqueous solution of sodium bicarbonate, followed by washing twice with water. The organic layer was concentrated and then distilled in vacuo to afford 2-ethyl-2-adamantyl methacrylate represented by the following formula in a yield of 60%.

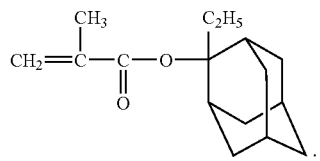

MONOMER SYNTHESIS EXAMPLE 3

Synthesis of α-methacryloyloxy-γ-butyrolactone

After charging 100 g of α-bromo-γ-butyrolactone and 104.4 g of methacrylic acid (2.0-fold molar excess relative to α-bromo-γ-butyrolactone), 3-fold weight excess of methyl isobutyl ketone was added to make a solution. To this solution, 183.6 g of triethylamine (3.0-fold molar excess relative to α-bromo-γ-butyrolactone) was dropped, and then stirred for about 10 hours at room temperature.

After filtration, the organic layer was washed with a 5% by weight aqueous solution of sodium bicarbonate, followed by washing twice with water. The organic layer was concentrated to afford α-methacryloyloxy-γ-butyrolactone represented by the following formula in a yield of 85%.

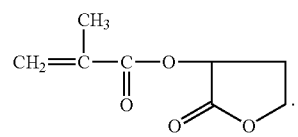

POLYMERIZATION INITIATOR SYNTHESIS EXAMPLE 1

Synthesis of tetrakis(2-bromoisobutyryl)pentaerythritol 5.00 g of pentaerythritol and 150 ml of anhydrous pyridine were charged and dissolved by heating to 70° C. with stirring. After cooling in an ice water bath, 52.9 g of 2-bromoisobutyryl bromide (6.27-fold molar excess relative to pentaerythritol) was dropped over about 9 min into the solution, which was then taken out from the ice water bath and stirred for 21 hours at room temperature.

The reaction system was again cooled down in an ice water bath, and methyl tert-butyl ether cooled beforehand in an ice water bath was added. This solution was washed with ion exchanged water cooled in an ice water bath, and the wash was extracted with methyl tert-butyl ether. The combined organic layer was washed with a 5% by weight aqueous solution of sodium bicarbonate, and further with ion exchanged water, followed by concentration using an evaporator.

This solution was subjected to crystallization with ion exchanged water, then recrystallized using methanol, and dried in vacuo to afford 20.35 g of tetrakis(2-bromoisobutyryl)pentaerythritol represented by the following formula (yield: 75.7%).

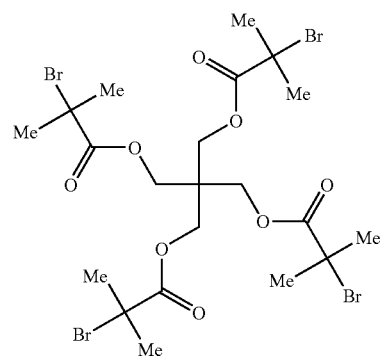

POLYMERIZATION INITIATOR SYNTHESIS EXAMPLE 2

Synthesis of octakis(2-bromoisobutyryl)sucrose

The polymerization initiator shown below was synthesized in a similar manner.

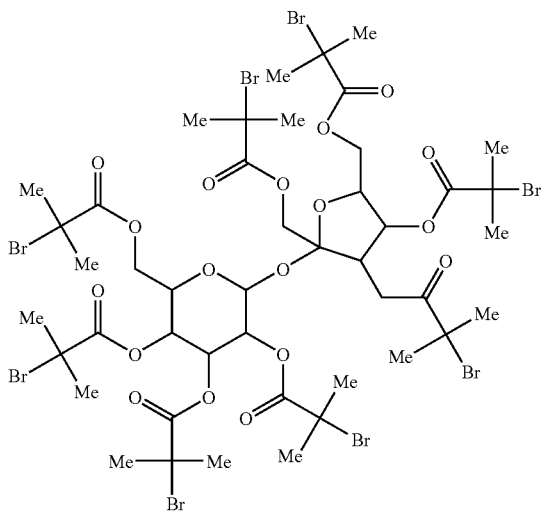

POLYMERIZATION INITIATOR SYNTHESIS EXAMPLE 3

Synthesis of pentakis(2-bromoisobutyryl)glucose

The polymerization initiator shown below was synthesized in a similar manner.

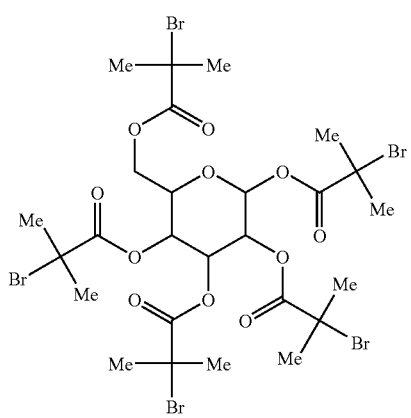

RESIN SYNTHESIS EXAMPLE 1

After charging 2-ethyl-2-adamantyl methacrylate, 3-hydroxy-1-adamantyl methacrylate, α-methacryloyloxy-γ-butyrolactone in a molar ratio of 5:2.5:2.5 (11.0 g: 5.23 g: 3.77 g), 0.746 g of tetrakis(2-bromoisobutyryl)pentaerythritol (polymerization initiator: molar ratio of 0.012 relative to the total monomers) and 2.19 g of 4,4'-dibutyl-2,2'-dipyridyl (molar ratio of 8.00 relative to the polymerization initiator) were charged, and then 3.55-fold weight excess of 1,4-dioxane relative to the total monomer was added to make a solution.

Nitrogen was bubbled through this solution for 30 min, and then 0.584 g of copper bromide (I) (molar ratio of 4.00 relative to the polymerization initiator) was added and heated for about 3 hours at 80° C. This polymerization solution was poured into a large volume of a mixed solution of methanol and water (methanol:water=8:2) to precipitate the product, and this procedure was repeated three times, followed by drying the product in vacuo.

The obtained powder was redissolved in methyl isobutyl ketone, washed with an aqueous solution of 0.5% oxalic acid, and then washed with ion exchanged water five times. The procedure to precipitate the product by pouring the organic layer into a large volume of a mixed solution of methanol and water (methanol:water=8:2) was carried out three times, and the obtained powder was dried in vacuo to yield a white powder resin (Star Polymer 1).

When the resin was measured by gel permeation chromatography calibrated with standard polystyrene samples, its weight average molecular weight was 3,500, and its molecular weight distribution was 1.1.

EXAMPLE OF RESIN SYNTHESIS 2

After charging 5.0 g of methyl methacrylate, 0.746 g of tetrakis(2-bromoisobutyryl)pentaerythritol (polymerization initiator: molar ratio of 0.012 relative to the total monomers), and 2.19 g of 4,4'-dibutyl-2,2'-dipyridyl (molar ratio of 8.00 relative to the polymerization initiator), 14.2-fold weight excess of 1,4-dioxane relative to the total monomer was added to make a solution.

Nitrogen was bubbled through this solution for about 30 min, and then 0.584 g of copper bromide (I) (molar ratio of 4.00 relative to the polymerization initiator) was added and heated for about 3 hours at 60° C.

Further to this reaction solution, a solution of 2-ethyl-2-adamantyl methacrylate and α-methacryloyloxy-γ-butyrolactone in a molar ratio of 1.0:1.0 (9.29 g: 6.37 g) that had been dissolved in 3.55-fold weight excess of 1,4-dioxane was added, followed by further incubation at the same temperature for one hour.

This polymerization solution was poured into a large volume of a mixed solution of methanol and water (methanol:water=8:2) to precipitate the product, and this procedure was repeated three times, followed by drying the product in vacuo.

The obtained powder was redissolved in methyl isobutyl ketone, washed with an aqueous solution of 0.5% oxalic acid, and then washed with ion exchanged water five times. The procedure to precipitate the product by pouring the organic layer into a large volume of a mixed solution of methanol and water (methanol:water=8:2) was carried out three times, and the obtained powder was dried in vacuo to yield a white powder resin (Star Polymer 25).

When the resin was measured by gel permeation chromatography calibrated with standard polystyrene samples, its weight average molecular weight was 12,000, and its molecular weight distribution was 1.2.

The star polymers synthesized in a similar manner are listed in Table 1 including the above star polymers 1 and 25.

TABLE 1

| Star Polymer | Monomers & Molar ratio of monomers | Mw | Mw/Mn | Central Core |
|---|---|---|---|---|
| 1 | EAMA/HAMA/GBMA = 50/25/25 | 3500 | 1.1 | P-4 |
| 2 | EAMA/NLM = 50/50 | 4000 | 1.1 | S-8 |
| 3 | EAMA/NLM = 50/50 | 5000 | 1.2 | S-8 |
| 4 | EAMA/NLM = 50/50 | 7600 | 1.2 | S-8 |
| 5 | EAMA/NLM = 50/50 | 10000 | 1.2 | S-8 |
| 6 | EAMA/NLM = 50/50 | 11000 | 1.2 | S-8 |
| 7 | EAMA/HAMA/GBMA = 50/25/25 | 13000 | 1.1 | S-8 |
| 8 | EAMA/HAMA/NLM/GBMA = 50/12.5/12.5/25 | 9700 | 1.2 | S-8 |
| 9 | EAMA/NLM = 50/50 | Bimodal | | G-5 |
| 10 | EAMA/NLM = 50/50 | 5300 | 1.2 | G-5 |
| 11 | EAMA/HAMA/GBMA = 50/25/25 | 7900 | 1.1 | G-5 |
| 12 | EAMA/HAMA/NLM/GBMA = 50/12.5/12.5/25 | 8100 | 1.4 | G-5 |
| 13 | EAMA/HAMA/NLM/GBMA = 50/12.5/12.5/25 | 12000 | 1.2 | G-5 |
| 14 | EAMA/NLM = 50/50 | 7300 | 1.2 | P-4 |
| 15 | EAMA/HAMA/GBMA = 50/25/25 | 8900 | 1.1 | P-4 |
| 16 | EAMA/HAMA/GBMA = 50/25/25 | 5300 | 1.2 | P-4 |
| 17 | EAMA/HAMA/GBMA = 50/25/25 | 5300 | 1.2 | P-4 |
| 18 | EAMA/HAMA/GBMA = 50/25/25 | 3100 | 1.1 | P-4 |
| 19 | EAMA/HAMA/GBMA = 50/25/25 | 3000 | 1.2 | P-4 |
| 20 | EAMA/HAMA/GBMA = 50/25/25 | 5800 | 1.2 | P-4 |
| 21 | EAMA/HAMA/GBMA = 50/10/40 | 3100 | 1.2 | P-4 |
| 22 | EAMA/HAMA/NLM/GBMA = 50/12.5/12.5/25 | 3000 | 1.2 | P-4 |
| 23 | EAMA/ECHMA/HAMA/NLM/GBMA = 25/20/5/20/30 | 3900 | 1.1 | P-4 |
| 24 | EAMA/ECHMA/HAMA/GBMA = 30/20/10/40 | 3600 | 1.2 | P-4 |
| 25 | MMA → EAMA/GBMA = 50/50*1 | 12000 | 1.2 | P-4 |
| 26 | MMA → EAMA/GBMA = 50/50*1 | 6600 | 1.2 | P-4 |

Mw: Weight average molecular weight of polymer
Mn: Number average molecular weight of polymer
P-4: Central core having 4 branches derived from tetrakis (2-bromoisobutyryl) pentaerythritol
S-8: Central core having 8 branches derived from octakis (2-bromoisobutyryl) sucrose
G-5: Central core having 5 branches derived from pentakis (2-bromoisobutyryl) glucose
*1: Initially, MMA was added to be polymerized, then EAMA and GBMA were added to be polymerized.

The structures of the monomers used are shown below.

MMA: Methyl methacrylate

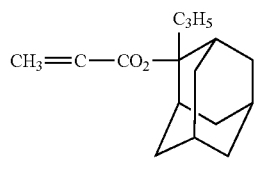

EAMA

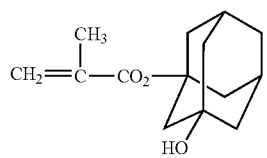

HAMA

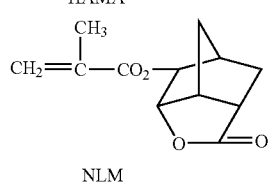

NLM

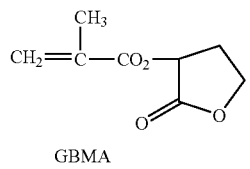

GBMA

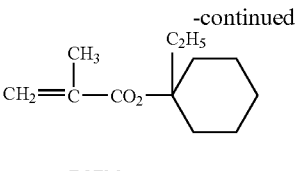

ECEMA

LINEAR RESIN SYNTHESIS EXAMPLE 1 FOR COMPARISON (EAMA/NLM=40/60)

After charging 23.34 g of norbornane lactone methacrylate, 1.39 g of 2-ethyl-2-adamantyl methacrylate, 0.86 g of azobisisobutyronitrile and 105.9 g of dioxane, the mixture was reacted at 87° C. for 6 hours. After the reaction, the reaction mixture was cooled and poured into a mixed solution of 424 g of methanol and 105 g of water to precipitate the product, and the precipitate was filtered and washed with methanol, and the obtained solid was dried in vacuo to obtain white resin. Its weight average molecular weight was 6,600, and its molecular weight distribution was 1.5.

LINEAR RESIN SYNTHESIS EXAMPLE 2 FOR COMPARISON (EAMA/HAMA/GBMA=50/25/25)

The reaction and after treatments were conducted in the same manner as in Linear Resin Synthesis Example 1 except that 21.73 g of 2-ethyl-2-adamantyl methacrylate, 10.34 g of 3-hydroxy-1-adamantyl methacrylate, 7.44 g of α-methacryloyloxy-γ-butyrolactone (GBMA), 0.86 g of azobisisobutyronitrile and 102.7 g of dioxane instead of 23.34 g of norbornane lactone methacrylate, 1.39 g of 2-ethyl-2-adamantyl methacrylate, 0.86 g of azobisisobutyronitrile and 105.9 g of dioxane to obtain white resin. Its weight average molecular weight was 8,800, and its molecular weight distribution was 1.57.

The polymers used in the following Examples and Comparative Examples are described in Table 2.

TABLE 2

| Polymer | Monomers & Molar ratio of monomers | Mw | Mw/Mn | Central Core |
|---|---|---|---|---|
| Star Polymer 1 (R1) | EAMA/HAMA/GBMA = 50/25/25 | 3500 | 1.1 | P-4 |
| Star Polymer 4 (R2) | EAMA/NLM = 50/50 | 7600 | 1.2 | S-8 |
| Star Polymer 7 (R3) | EAMA/HAMA/GBMA = 50/25/25 | 13000 | 1.1 | S-8 |
| Star Polymer 11 (R4) | EAMA/HAMA/GBMA = 50/25/25 | 7900 | 1.1 | G-5 |
| Star Polymer 14 (R5) | EAMA/NLM = 50/50 | 7300 | 1.2 | P-4 |
| Linear Polymer 1 (R6) | EAMA/NLM = 40/60 | 6600 | 1.5 | None |
| Linear Polymer 2 (R7) | EAMA/HAMA/GBMA = 50/25/25 | 8800 | 1.6 | None |

The following components were mixed and dissolved, further, filtrated through a fluorine resin filter having pore diameter of 0.2 μm, to prepare resist liquid.

<Polymer>
10 parts of polymer described in Table 3.

<Acid Generator>
S1: 0.01 part of 1-(2-oxo-2-phenylethyl)tetrahydrothiophenium perfluorobutanesulfonate <Quencher>
Q1: 0.01 part of 2,6-diisopropylaniline <Solvent>
Y1: 51.5 parts of propylene glycol monomethyl ether acetate, 35.0 parts of 2-heptanone and 3.5 parts of γ-butyrolactone Silicon wafers were each coated with "ARC-29A-8", which is an organic anti-reflective coating composition available from Brewer Co., and then baked under the conditions: 215° C., 60 seconds, to form a 780 Å-thick organic anti-reflective coating. Each of the resist liquids prepared as above was spin-coated over the anti-reflective coating so that the thickness of the resulting film became 0.25 μm after drying. The silicon wafers thus coated with the respective resist liquids were each prebaked on a direct hotplate at temperature shown in "PB" column in Table 3 for 60 seconds. Using an ArF excimer stepper ("NSR ArF" manufactured by Nikon Corporation, NA=0.55, 2/3 Annular), each wafer thus formed with the respective resist film was subjected to line and space pattern exposure, with the exposure quantity being varied stepwise.

After the exposure, each wafer was subjected to post-exposure baking on a hotplate at temperature shown in "PEB" column in Table 3 for 60 seconds and then to puddle development for 60 seconds with an aqueous solution of 2.38 wt % tetramethylammonium hydroxide.

Reflow Step was conducted by baking on a hotplate at 165° C. for 60 seconds after the development.

Each of a dark field pattern developed on the organic anti-reflective coating substrate after the development was observed with a scanning electron microscope, the results of which are shown in Table 4. The term "dark field pattern", as used herein, means a pattern obtained by exposure and development through a reticle comprising chromium base surface (light-shielding portion) and linear glass layers (light-transmitting portion) formed in the chromium surface and aligned with each other. Thus, the dark field pattern is such that, after exposure and development, resist layer surrounding the line and space pattern remains on substrate.

Effective Sensitivity:
It is expressed as the amount of exposure that the line pattern (light-shielding layer) and the space pattern (light-transmitting layer) become 1:1 after exposure through 0.13 μm line and space pattern mask and development.

Resolution:
It is expressed as the minimum size of space pattern which gave the space pattern split by the line pattern at the exposure amount of the effective sensitivity.

Line Edge Roughness
When line edge roughness is very good, its evaluation is marked by "◎".
When line edge roughness is good, its evaluation is marked by "○".
When line edge roughness is poor, its evaluation is marked by "X".

TABLE 3

| Example No. | Acid Resin | Generator | Quencher | Solvent | PB | PEB |
|---|---|---|---|---|---|---|
| Ex. 1 | R1 | S1 | Q1 | Y1 | 130° C. | 110° C. |
| Ex. 2 | R2 | S1 | Q1 | Y1 | 130° C. | 110° C. |
| Ex. 3 | R3 | S1 | Q1 | Y1 | 120° C. | 105° C. |
| Ex. 4 | R4 | S1 | Q1 | Y1 | 130° C. | 110° C. |
| Ex. 5 | R5 | S1 | Q1 | Y1 | 130° C. | 110° C. |
| Comp. Ex. 1 | R6 | S1 | Q1 | Y1 | 130° C. | 110° C. |
| Comp. Ex. 2 | R7 | S1 | Q1 | Y1 | 120° C. | 105° C. |

TABLE 4

| Example No. | Effective Sensitivity (mJ/cm$^2$) | Resolution (μm) | Line Edge Roughness |
|---|---|---|---|
| Ex. 1 | 80 | 0.13 | ○ |
| Ex. 2 | 42.5 | 0.13 | ○ |
| Ex. 3 | 92.5 | 0.13 | ○ |
| Ex. 4 | 62.5 | 0.13 | ◎ |

TABLE 4-continued

| Example No. | Effective Sensitivity (mJ/cm$^2$) | Resolution (μm) | Line Edge Roughness |
|---|---|---|---|
| Ex. 5 | 40 | 0.13 | ◎ |
| Comp. Ex. 1 | 42.5 | 0.13 | X |
| Comp. Ex. 2 | 70 | 0.13 | ○ |

As is apparent from Table 4, the resists of the Examples 1 to 5 that represent the present composition showed results that line edge roughness was excellent while presenting equal or higher sensitivity and resolution compared to the resists of Comparative Examples 1 and 2.

The chemically amplified positive resist composition of the present invention that contains Star Polymer and an acid generator is excellent in adhesiveness to a substrate as well as in various resist performances such as dry etching resistance, sensitivity, and resolution, and particularly in line edge roughness. Accordingly, this composition is suitable for exposure with KrF excimer laser, ArF excimer laser, and the like, thereby providing a resist pattern with a high performance.

What is claimed is:

1. A star polymer which comprises a central core and three or more branches bonded to the central core, and has a weight average molecular weight of from 1,000 to 100,000, wherein at least one of the branches containing at least one repeating unit selected from the group consisting of the following repeating units of the formulae (1), (2), (3), (4) and (9);

the formula (1)

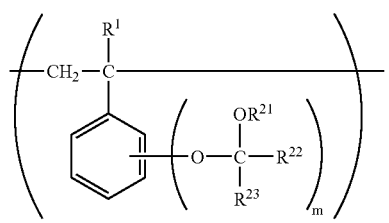

(1)

wherein R$^1$ represents a hydrogen atom, an alkyl group having 1 to 4 carbon atoms, or a fluoroalkyl group having 1 to 4 carbon atoms, R$^{21}$ and R$^{22}$ each independently represents an alkyl group having 1 to 6 carbon atoms, a cycloalkyl group having 3 to 6 carbon atoms, a haloalkyl group having 1 to 6 carbon atoms, a halocycloalkyl group having 3 to 10 carbon atoms, or a phenyl group wherein at least one hydrogen atom in the phenyl group may be substituted by an alkyl group having 1 to 4 carbon atom or a halogen atom, or R$^{21}$ and R$^{22}$ bond to form a divalent saturated aliphatic hydrocarbon group having from 5 to 10 carbon atoms, R$^{23}$ represents a hydrogen atom, an alkyl group having 1 to 10 carbon atoms, a cycloalkyl group having 3 to 10 carbon atoms, a haloalkyl group having 1 to 10 carbon atoms, a halocycloalkyl group having 3 to 10 carbon atoms, or an aralkyl group having 7 to 12 carbon atoms, with the proviso that R$^{22}$ is methyl, or the carbon atom in R$^{22}$ linked to the carbon atom adjacent to R$^{22}$ is a secondary or primary carbon atom when R$^{23}$ is a hydrogen atom or the carbon atom in R$^{23}$ linked to the carbon atom adjacent to R$^{22}$ is a tertiary carbon atom, m is an integer of 1 to 3 and when m is 2 or 3, each of the group of the formula —(OC(OR$^{21}$)R$^{22}$R$^{23}$) may be the same or different;

the formula (2)

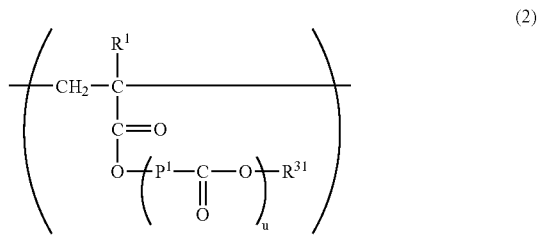

(2)

R$^{31}$ represents a hydrocarbon group having 1 to 20 carbon atoms or a group of the formula —CH(R$^{33}$)—OR$^{34}$, u is an integer of 0 to 2, —CH$_2$— in R$^{31}$ not linked to the oxygen adjacent to R$^{31}$ may be substituted by —COO— or —O—, and at least one hydrogen atom in R$^{31}$ may be substituted by a hydroxyl group, a cyano group, a halogen atom or an alkoxy group, R$^{33}$ represents an alkyl group having 1 to 5 carbon atoms or an alicyclic hydrocarbon group having 3 to 10 carbon atoms, R$^{34}$ represents an alkyl group having 1 to 3 carbon atoms, an alicyclic hydrocarbon group having 3 to 10 carbon atoms, a group of the formula —R$^{40}$—O—R$^{41}$, or a group of the formula —R$^{42}$—O(C=O)—R$^{43}$, or R$^{33}$ and R$^{34}$ bond to form an divalent saturated aliphatic hydrocarbon group having from 3 to 10 carbon atoms, in the divalent aliphatic hydrocarbon group, —CH$_2$— not linked to the oxygen adjacent to R$^{31}$ may optionally be substituted by —COO— or —O—, R$^{40}$ represents a divalent saturated aliphatic hydrocarbon group having 1 to 5 carbon atoms or a divalent alicyclic hydrocarbon group having 3 to 10 carbon atoms, R$^{41}$ represents an alkyl group having 1 to 5 carbon atoms or an alicyclic hydrocarbon group having 3 to 10 carbon atoms, R$^{42}$ represents a divalent saturated aliphatic hydrocarbon group having 1 to 5 carbon atoms or a divalent alicyclic hydrocarbon group having 3 to 10 carbon atoms, R$^{43}$ represents an alkyl group having 1 to 5 carbon atoms or an alicyclic hydrocarbon group having 3 to 10 carbon atoms;

P$^1$ represents a single bond, or an alkylene group having 1 to 12 carbon atoms, or an alicyclic hydrocarbon group having 3 to 7 carbon atoms;

the formula (3)

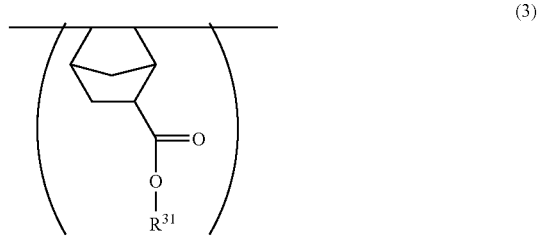

(3)

wherein R$^{31}$ has the same meaning as defined above, the formula (4)

(4)

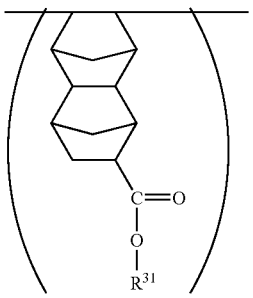

wherein R³¹ has the same meaning as defined above, the formula (9)

(9)

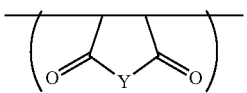

wherein Y represents an oxygen atom or —NH—, and the central core is a structural unit of the formula (I)

(I)

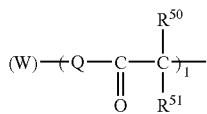

wherein (W) represents a polyvalent aromatic hydrocarbon group, a polyvalent saturated cyclic hydrocarbon group, a polyvalent saturated acyclic hydrocarbon group or a group combined by at least two of the polyvalent aromatic hydrocarbon group, the polyvalent saturated cyclic hydrocarbon group and the polyvalent saturated acyclic hydrocarbon group, wherein at least one —CH₂— in the polyvalent saturated cyclic hydrocarbon group and the polyvalent saturated acyclic hydrocarbon group not linked to Q may optionally be substituted by —O—, —S—, —NR⁵²— or —SiR⁵³₂— and at least one hydrogen atom in the polyvalent aromatic hydrocarbon group and the polyvalent saturated cyclic hydrocarbon group may optionally be substituted by an alkyl group having 1 to 6 carbon atoms, R⁵² and R⁵³ each independently represents a hydrogen atom or an alkyl group having 1 to 6 carbon atoms, Q represents —O—, —S— or —NR⁵⁴—, wherein R⁵⁴ represents a hydrogen atom or an alkyl group having 1 to 6 carbon atoms, R⁵⁰ and R⁵¹ each independently represents an alkyl group having 1 to 6 carbon atoms, an alkylalkoxy group having 2 to 6 carbon atoms or a cycloalkyl group having 3 to 12 carbon atoms, or R⁵⁰ and R⁵¹ link together and represent a divalent saturated aliphatic hydrocarbon group which bonds to form a divalent cyclic hydrocarbon group together with a carbon atom adjacent to R⁵⁰ and R⁵¹, and 1 represents an integer of 3 to 12.

2. The star polymer according to claim 1, wherein at least one of the branches contains at least one repeating unit selected from the group consisting of the repeating units (1), (2), (3) and (4).

3. The star polymer according to claim 1, wherein the polymer is insoluble or poorly soluble in an alkali aqueous solution but becomes soluble in an alkali aqueous solution by the action of an acid.

4. The star polymer according to claim 1, wherein (W) is neopentan-tetrayl group, 2,2',2"-nitrilotriethyl group, 2-methyltetrahydropyran-α, 3,4,5,6-pentayl group, 2-methyltetrahydrothiopyran-α, 3,4,5,6-pentayl group, 2,5-dimethyltetrahydrofuran-α, α', 2,3,4-pentayl group, or a group combined by at least two of them.

5. The star polymer according to claim 1, wherein central core is a structural unit selected from the following formulae:

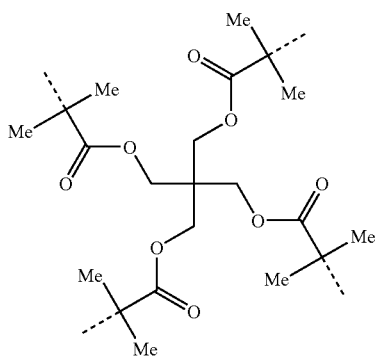

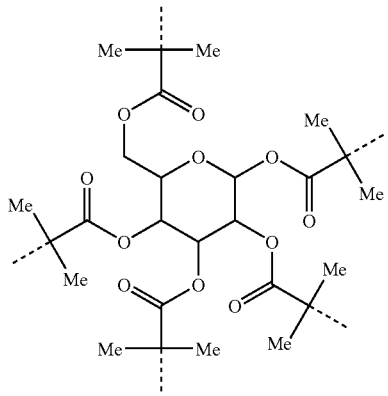

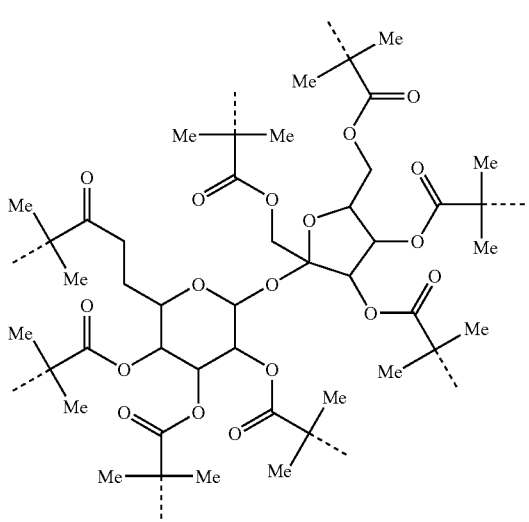

6. The star polymer according to claim 1, which is obtainable by reacting a radical polymerization initiator of the following formula (10) with a monomer leading to a repeating unit of at least one of the formulae (1), (2), (3), (4) and (9):

$$Z-T_p \quad (10)$$

wherein Z is a structural unit of the formula (I), T represents a radically transferable atom or group, and p represents an integer of 3 to 12.

7. The star polymer according to claim 6, wherein the radical polymerization initiator is a compound obtained by acylating a compound of 3 to 100 carbon atoms having three or more groups in total selected from the group consisting of hydroxyl group, thiol group, and N-alkylamino group with an acylating agent having a radically transferable atom or group, and —CH$_2$— in said compound may optionally be substituted by —O—, —S—, —NR$^{52}$—, or —SiR$^{53}{}_2$—, wherein R$^{52}$ and R$^{53}$ have the same meanings as defined above.

8. The star polymer according to claim 6, wherein the radical polymerization initiator is a compound selected from the group consisting of a compound obtained by acylating a polyhydric alcohol of 3 to 100 carbon atoms having three or more hydroxyl groups with an acylating agent having a radically transferable atom or group, a compound obtained by acylating a polythioalcohol of 3 to 100 carbon atoms having three or more thiol groups with an acylating agent having a radically transferable atom or group, and a compound obtained by acylating a polyamine of 3 to 100 carbon atoms having three or more N-alkylamino groups with an acylating agent having a radically transferable atom or group, and —CH$_2$— in the compounds may optionally be substituted by —O—, —S—, —NR$^{52}$—, or —SiR$^{53}{}_2$—, wherein R$^{52}$ and R$^{53}$ have the same meaning as defined above.

9. The star polymer according to claim 6, wherein the radical polymerization initiator is a compound selected from the group consisting of a compound in which hydroxyl groups of a polysaccharide or monosaccharide are acylated with an acylating agent having a radically transferable atom or group, a compound in which hydroxyl groups of a cycloalkylpolyol or alkylpolyol are acylated with an acylating agent having a radically transferable atom or group, a compound in which hydroxyl groups of a polyhydric amine are acylated with an acylating agent having a radically transferable atom or group, a compound in which hydroxyl groups of an aromatic ring are acylated with an acylating agent having a radically transferable atom or group, a compound in which hydroxyl groups of an alkylpolythiol are acylated with an acylating agent having a radically transferable atom or group and a compound in which amino groups of an alkylamine are acylated with an acylating agent having a radically transferable atom or group.

10. The star polymer according to claim 6, wherein the radical polymerization initiator is a compound selected from the group consisting of per(2-bromoisobutyryl)cyclodextrin, per(2-bromoisobutyryl)maltotriose, tetrakis(2-bromoisobutyryl)arabinose, tris(2-bromoisobutyryl)cyclohexanetriol, tetrakis(2-bromoisobutyryl)pentaerythritol, hexa(2-bromoisobutyryl)mannitol, tris(2-bromoisobutyryl)triethanolamine, tris(2-bromoisobutyryl)benzenetriol, tris(2-bromoisobutyryl)trihydroxypyrimidine, tetrakis(2-bromoisobutyryl)pentaerythrithiol, tetrakis(2-bromoisobutyryl)2,2-bis(mercaptomethyl)-1,4, butanedithiol, tetrakis(2-bromoisobutyryl)spermine and tris (2-bromoisobutyryl)spermidine, tetrakis(2-chloroisobutyryl)pentaerythritol, tetrakis(2-iodoisobutyryl) pentaerythritol, hexakis(2-bromoisobutyryl) dipentaerythritol, and octakis(2-bromoisobutyryl)sucrose.

11. The star polymer according to claim 6, wherein the radical polymerization initiator is a compound selected from the group consisting of at least one of compounds represented by the following formulae:
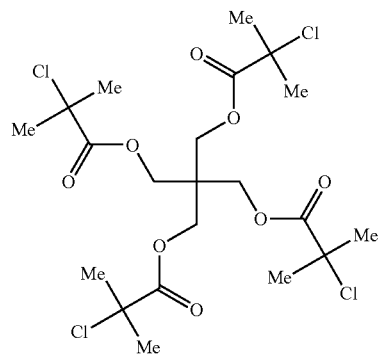
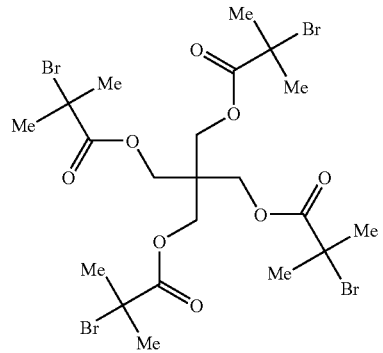
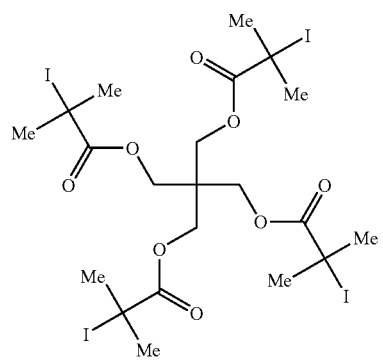
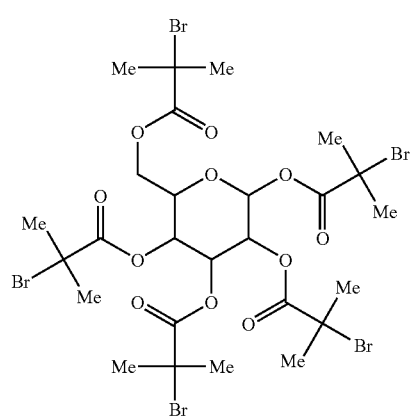
-continued
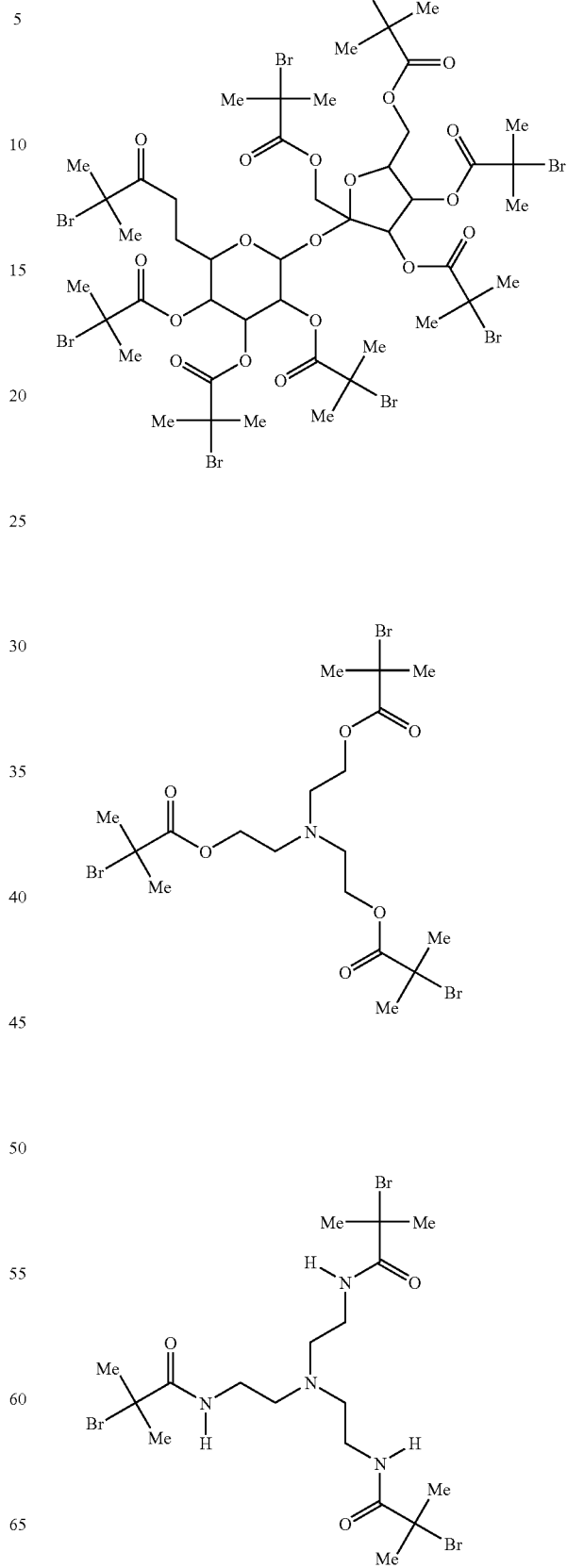

-continued
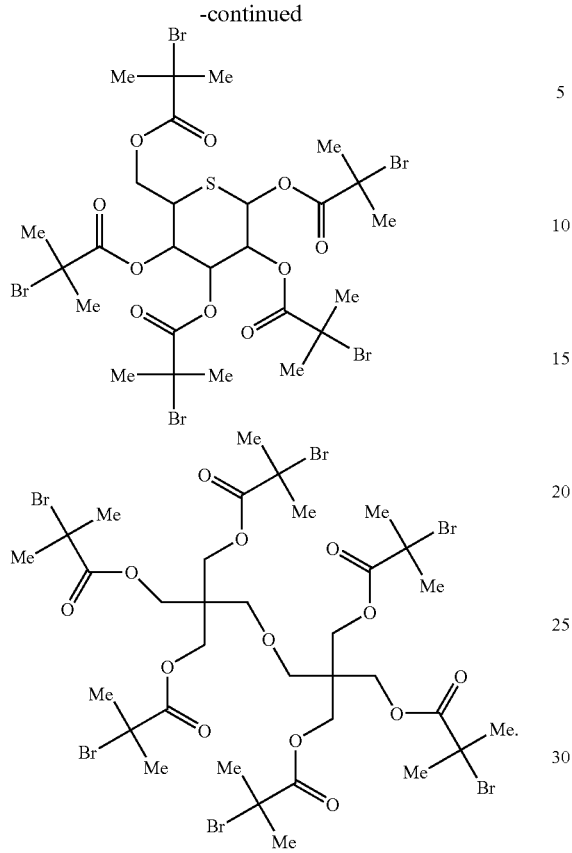
* * * * *